(12) United States Patent
Morton et al.

(10) Patent No.: US 11,018,770 B2
(45) Date of Patent: May 25, 2021

(54) SILICON PHOTONICS PHASED ARRAY SYSTEMS

(71) Applicant: Morton Photonics, West Friendship, MD (US)

(72) Inventors: Paul A. Morton, West Friendship, MD (US); Jacob Khurgin, Pikesville, MD (US)

(73) Assignee: Morton Photonics, West Friendship, MD (US)

( * ) Notice: Subject to any disclaimer, the term of this patent is extended or adjusted under 35 U.S.C. 154(b) by 0 days.

(21) Appl. No.: 16/896,915

(22) Filed: Jun. 9, 2020

(65) Prior Publication Data

US 2021/0006333 A1    Jan. 7, 2021

Related U.S. Application Data

(63) Continuation of application No. 16/393,842, filed on Apr. 24, 2019, now Pat. No. 10,727,947, and a continuation of application No. 16/357,248, filed on Mar. 18, 2019, now Pat. No. 10,715,254, which is a continuation of application No. 16/156,087, filed on
(Continued)

(51) Int. Cl.
| | |
|---|---|
| *H04B 10/2575* | (2013.01) |
| *H01Q 3/26* | (2006.01) |
| *G02B 27/00* | (2006.01) |
| *H04Q 11/00* | (2006.01) |
| *H04B 10/516* | (2013.01) |
| *H04B 10/50* | (2013.01) |

(Continued)

(52) U.S. Cl.
CPC ....... *H04B 10/25759* (2013.01); *G02B 27/00* (2013.01); *H01Q 3/2676* (2013.01); *H04B 10/40* (2013.01); *H04B 10/50* (2013.01); *H04B 10/516* (2013.01); *H04B 2210/006* (2013.01); *H04Q 5/00* (2013.01); *H04Q 11/00* (2013.01)

(58) Field of Classification Search
None
See application file for complete search history.

(56) References Cited

U.S. PATENT DOCUMENTS

| 4,736,463 A * | 4/1988 | Chavez | H01Q 3/2676 359/107 |
|---|---|---|---|
| 2009/0002236 A1* | 1/2009 | Zhou | H01Q 3/2676 342/375 |

(Continued)

*Primary Examiner* — Darren E Wolf
(74) *Attorney, Agent, or Firm* — Nadya Reingand; Yan Hunkin

(57) ABSTRACT

High-performance ultra-wideband Phased Array Antennas (PAA) are disclosed, having unique capabilities, enabled through photonic integrated circuits and novel optical architectures. Unique capabilities for PAA systems are enabled by photonic integration and ultra-low-loss waveguides. Novel aspects include optical multiplexing combining wavelength division multiplexing and/or a novel extension to array photodetectors, providing the capability to combine many RF photonic signals with very low loss. Architectures include tunable optical up-conversion and down-conversion systems, moving a chosen frequency band between baseband and a high RF frequency band with high dynamic range. Simultaneous multi-channel RF beamforming is achieved through power combining/splitting of optical signals.

18 Claims, 29 Drawing Sheets

Related U.S. Application Data

Oct. 10, 2018, now Pat. No. 10,277,324, which is a continuation of application No. 15/399,563, filed on Jan. 5, 2017, now Pat. No. 10,128,952.

(60) Provisional application No. 62/274,904, filed on Jan. 5, 2016.

(51) Int. Cl.
*H04Q 5/00* (2006.01)
*H04B 10/40* (2013.01)

(56) References Cited

U.S. PATENT DOCUMENTS

| | | | |
|---|---|---|---|
| 2011/0124347 A1* | 5/2011 | Chen | H04W 64/00 455/456.1 |
| 2014/0218240 A1* | 8/2014 | Kpodzo | G01S 5/0215 342/450 |
| 2015/0309261 A1* | 10/2015 | Kobyakov | G02B 6/1228 385/14 |

* cited by examiner

| MCSB-PIC #1 | MCSB-PIC #2 | MCSB-PIC #3 | MCSB-PIC #4 |
|---|---|---|---|
| MCSB-PIC #5 | MCSB-PIC #6 | MCSB-PIC #7 | MCSB-PIC #8 |
| MCSB-PIC #9 | MCSB-PIC #10 | MCSB-PIC #11 | MCSB-PIC #12 |
| MCSB-PIC #13 | MCSB-PIC #14 | MCSB-PIC #15 | MCSB-PIC #16 |

Figure 2

|  | Prior art design, 1.1 μm depletion width | Extended transit time, 2 μm depletion width | Extended transit time, 4 μm depletion width |
|---|---|---|---|
| Single photodetector | | | |
| Transit time bandwidth | 71 GHz | 30 GHz | 14 GHz |
| Capacitance | 21 fF | 12 fF | 6 fF |
| Parasitic bandwidth | 74 GHz | 130 GHz | 260 GHz |
| Total bandwidth | 51 GHz | 29 GHz | 14 GHz |
| 8 PD Array | | | |
| Capacitance | 168 fF | 96 fF | 48 fF |
| Parasitic bandwidth | 9.25 GHz | 16.25 GHz | 32.5 GHz |
| Total bandwidth | 9 GHz | 14.3 GHz | 12.85 GHz |
| 32 PD Array | | | |
| Capacitance | 672 fF | 384 fF | 192 fF |
| Parasitic bandwidth | 2.3 GHz | 4 GHz | 8 GHz |
| Total bandwidth | 2.3 GHz | 4 GHz | 7 GHz |

Figure 29

SILICON PHOTONICS PHASED ARRAY SYSTEMS

CROSS-REFERENCE TO RELATED APPLICATIONS

This patent application is a Continuation-in-Part of U.S. patent application Ser. No. 16/393,842 filed Apr. 24, 2019, currently allowed, it is also a Continuation-in-Part of U.S. patent application Ser. No. 16/357,248, filed Mar. 18, 2019, and currently allowed, which in its turn is a Continuation of U.S. patent application Ser. No. 16/156,087, filed on Oct. 10, 2018, now issued as U.S. Pat. No. 10,277,324, which in turn is a Continuation of U.S. patent application Ser. No. 15/399,563, filed on Jan. 5, 2017, now issued as U.S. Pat. No. 10,128,952, which in turn claims priority to U.S. Provisional Patent Application Ser. No. 62/274,904, filed Jan. 5, 2016, all the disclosures of which are fully incorporated herein by reference.

STATEMENT REGARDING FEDERALLY SPONSORED RESEARCH AND DEVELOPMENT

This invention was made with U.S. Government support under Contract FA8650-15-C-1863, an Air Force SBIR Project, and the U.S. Government has certain rights in the invention.

FIELD OF INVENTION

This invention relates to high performance active radio frequency (RF) phased array antenna systems, RF beamforming systems, RF up-converter systems, RF down-converter and channelizer systems, and RF photonics systems, enabled by photonic integrated circuit (PIC) devices.

BACKGROUND

CMOS foundry based silicon photonics devices provide the opportunity for high volume, low cost devices; ideal candidates for use in Phased Array Antenna (PAA) systems, which require processing for 1000's of elements per antenna, supporting the use of large array Photonic Integrated Circuit (PIC) devices. Applications include active radar PAA systems, Receive PAA systems, PAA systems for communications, plus multifunction systems that simultaneously utilize the same antenna for multiple applications, each potentially with multiple RF beams, at the same time. A large scale commercial application is multiple channel RF beamforming for 5G cellular systems, also known as Massive MIMO. Advances in photonic integration, including heterogeneous integration of III-V materials to fabricate lasers, linear modulators, and photodetectors; ultra-low-loss silicon nitride waveguides for high performance filters and time delay devices; and heterogeneous integration of magneto optic materials to create optical isolators; enable the design and fabrication of complex PIC devices that can provide unique capabilities for PAA systems that cannot be obtained with electronic technologies. This invention utilizes these advanced photonic devices integrated onto large size (wafer scale) PIC devices to enable a future generation of advanced PAA systems.

SUMMARY

This section highlights some of the key requirements for Receive (Rx)-PAA systems and Transmit (Tx)-PAA systems, and how these can be achieved using PIC technology and novel photonic architectures. Advanced PIC based Rx-PAA systems can provide unique capabilities, including but not limited to:
1. Ultra-Wideband Operation;
2. Multiple Channel Simultaneous RF Beamforming;
3. Optical Gain;
4. Optical Down-Conversion;
5. True Time Delay;
6. Tunable Optical Rejection of Interfering Signals;
7. Optically Generated Ultra-Wideband Local Oscillator;
8. Channelizer functionality.

Similar unique capabilities can be obtained for Tx-PAA systems utilizing advanced PIC technology, including but not limited to:
1. Ultra-Wideband Operation;
2. Multiple Channel Simultaneous RF Beamforming;
3. Optical Gain;
4. Optical Up-Conversion.
5. True Time Delay;
6. Optically Generated Ultra-Wideband Local Oscillator;

Ultra-Wideband Operation over very large frequency ranges, e.g. 1-50 GHz, as well as large instantaneous bandwidth, 1 GHz and higher, while also providing the following unique capabilities;

Multiple Channel Simultaneous RF Beamforming is the equivalent of having multiple separate complete electronic PAA systems all housed within a single PAA system. On the Rx-PAA this is achieved in this novel architecture through optical power splitting of the RF and Local Oscillator (LO) optical signals to create multiple exact replicas of the signals that are then processed independently within the PIC device. On the Tx PAA this is achieved by combining multiple separate transmit signals, generated optically on the PIC, using an array photodetector or group array photodetector combiner (GAPC), or through the use of wavelength division multiplexing (WDM) to combine signals optically providing a single output from a single photodetector.

Optical Gain in the Rx-PAA architecture provides scaling of optical performance with the number of antenna elements, taking advantage of the large number of antenna elements for high optical gain. This gain can overcome the initial conversion loss from electronic to photonic signals, support the optical splitting required for multiple channel simultaneous RF beamforming, and support high spurious free dynamic range (SFDR) system operation. In the Tx-PAA architecture, optical gain can be achieved by generating multiple optical channels using the same RF signal, and combining them to provide a higher output signal, i.e. optical gain.

Optical Down-Conversion is a photonic capability that converts a chosen frequency band down to the IF band by simply replacing the optical carrier with an optical LO carrier at the appropriate frequency. This overcomes the large mixing spurs that occur using electronic mixers that significantly degrade SFDR in wide instantaneous bandwidth systems.

True Time Delay devices with large tunable delay, wide bandwidth and high system SFDR based on ultra-low loss (ULL) silicon nitride or ULL silicon waveguides and microresonators.

Tunable Optical Rejection of Interfering Signals across the full bandwidth of future PAA systems can be provided by ultra-high-Q optical microresonator filters designed in silicon nitride, ULL silicon waveguides, or other ULL waveguides systems. This capability can be used to eliminate co-site interference or jamming signals from an adversary.

An Optically Generated UWB Local Oscillator can be added through integration of two frequency locked ultra-low phase noise lasers. An optically generated LO eliminates the need for a low phase noise RF LO signal at every antenna element, and provides a much wider LO frequency range, e.g. 1-100 GHz.

Channelizer functionality is an inherent capability of the tunable optical down-conversion Rx-PAA, which provides a tunable single frequency band channelizer. Using a novel system architecture this can be expanded to create a tunable multiple frequency band channelizer, or in the limit a full channelizer.

Optical Up-Conversion is a photonic capability that converts a chosen frequency band up from the IF band to a higher microwave frequency by simply replacing the optical carrier with an optical LO carrier at the appropriate frequency.

Phased Array Antenna (PAA) Optical Architectures.

The novel system optical architectures of this invention provide a PIC enabled PAA system that can provide performance required in a future system, e.g. 8 or more simultaneous RF beams with ultra-wide instantaneous bandwidth (≥1 GHz), a wide operating frequency range (1-50 GHz), high SFDR (≥120 $dB \cdot Hz^{2/3}$) and low Noise Figure (NF), <10 dB. The Rx-PAA design was validated through system simulations, which are described in the detailed description. The Tx-PAA system takes advantage of the same technologies to create unique system performance.

The Multiple Channel Simultaneous Beamforming (MCSB)-PIC device forms the basis of the optical architecture. In the Rx-PAA this MCSB-PIC provides complete optical processing of signals from, e.g. 64 antenna elements in an 8×8 array, including; converting the antenna electrical signal to an RF photonic signal, filtering, time delaying and attenuating that RF signal, generating an LO optical signal—also with appropriate optical filtering (if required), phase control and attenuation, down-converting the required frequency band of the RF signal to baseband (optical down-conversion) by combining the RF and LO signals, then combining all signals to provide a single output for the 64 antenna elements. Alternative MCSB-PIC designs can support different numbers of antenna elements. Receive multiple simultaneous beamforming is achieved by optically splitting the RF Photonic and LO signals from each antenna element, e.g. a simple 1:8 optical power splitter, and then each of these channels is processed separately by passing through their own set of filters, TTD, attenuators, combining, etc. The use of large-scale integration through the silicon photonics platform, utilizing CMOS compatible designs and a CMOS foundry, allows the signal paths to be replicated many times on chip, e.g. 64×, to provide the required functionality on a single PIC device.

In the Tx-PAA, the MCSB-PIC works in a similar way. RF signals at high RF frequencies, or baseband IF signals requiring up-conversion, are used to generate optical signals in the MCSB-PIC, the MCSB-PIC having either one or multiple optical signals per antenna element. For the simple case of a single optical signal per antenna element, the signal is generated by a modulator, the signal is time delayed and attenuated, as required, before passing to a high-speed, high-power photodetector, said photodetector providing the electrical signal for the antenna element. Optionally, an electronic power amplifier (PA) may be included after the photodetector to increase the signal level applied to the transmit antenna element. Multiple optical signals may be generated per antenna element within the MCSB-PIC—either one signal per required RF beam, and/or multiple identical signals, in order to provide a higher optical power at the combiner and therefore a higher signal to the antenna element. This type of setup also avoids the need for a PA. The MCSB-PIC up-converts the baseband RF signal to the required transmit frequency band with extremely high fidelity by combining the filtered optical RF signal and the optical LO signal, in a manner similar to optical down-conversion in the Rx-PAA system.

A generic PAA system is shown in FIGS. 1 and 2; the front side of the antenna in FIG. 1 includes 1024 antenna elements (32×32), while the backside of that antenna in FIG. 2 includes 16 wafer scale MCSB-PIC modules tiled across the antenna, each MCSB-PIC supporting 64 antenna elements (8×8). Large size (wafer scale) devices can provide all the required functionality for 64 antenna elements within a single PIC.

Two Rx-PAA optical architectures are described below:

Full Optical System; including two-stage optical multiplexing, e.g. 1024× or 4096×, as shown in FIGS. 3 and 4. In the full optical system, the wavelength division multiplexed signals for each simultaneous channel exit each MCSB-PIC device for a second stage of optical multiplexing in either an array photodetector, or in the proposed novel Group Array Photodetector Combiner (GAPC) device. This two stage multiplexing provides tremendous optical gain, e.g. 1024 optical signals are combined to provide a single RF output, which provides for high system performance.

Modular Hybrid Optical/Digital (MHOD) System; single stage multiplexing, e.g. 64×, as shown in FIG. 5. The MHOD system, which provides all the unique capabilities of the optical approach, with e.g. 64× optical signal multiplexing (less optical gain than the Full Optical System), with the electrical output for each simultaneous channel of each MCSB-PIC device being digitized and processed with a digital signal processor (DSP) before the 16 digital signals for each simultaneous channel are combined to form an Rx-PAA RF output. The DSP can also be utilized to increase the linearity of the system, improving SFDR, by removing the non-linear (sinusoidal) transfer characteristic of the modulators and other nonlinear elements in the optical signal path; this can be accomplished by applying the inverse transfer response in the DSP, i.e. digital post-processing equalization. A similar DSP can be utilized in the full optical system to increase SFDR, however, in that case only one DSP is required per simultaneous beamforming channel.

The MHOD design allows for all optical components and interconnects to be within a single PIC device with no optical inputs or outputs; only electrical connections to the antenna, LO, RF/IF inputs and outputs, and control signals are required. While the MCSB-PIC supports only 64 antenna elements in the MHOD system, i.e. a sub-array in a larger PAA system, this number of antenna elements is appropriate for RF beamforming in, e.g., 5G cellular systems. Such systems will operate in the millimeter wave band with a few GHz of bandwidth, e.g., 2 GHz bandwidth around 28 GHz or 39 GHz. The Tx MCSB-PIC device provides optical up-conversion from baseband, where high-speed digital to analog converter (DAC) devices can provide the RF signals, e.g. from 2 GHz to 4 GHz, and up-convert to 28 GHz or 39 GHz (or higher). The Rx MCSB-PIC device will then provide high-performance optical down-conversion to baseband/IF, after which a high performance (i.e. high effective number of bits, ENOB) analog to digital converter (ADC) can digitize the receive signal.

Multiple Tx-PAA optical architectures are available based on the provided examples and equivalents thereof. Basic architectures operate directly at the required transmit frequencies, e.g. 10 GHz or 50 GHz; the RF input signal being converted to an optical signal before time delay and before the required attenuation is applied, before conversion back to an electrical signal in a photodetector. Multiple RF beams per antenna element are generated as separate optical channels, and are combined using either an array photodetector combiner or GAPC device, or by generating multiple WDM optical channels and combining the multiple WDM optical channels in a WDM multiplexer before conversion to an electrical signal via a single photodetector. These multiple optical channels can be used to create multiple RF beams. Additionally, multiple channels of the same signal can be used to create a larger electrical output signal from the photodetector, or the array photodetector, in order to provide some optical gain.

Further Tx-PAA optical architectures include optical up-conversion within the design, using similar technology to the down-conversion used in the Rx-PAA, i.e., filtering of the signal channel, creation of an optical LO, and combining these optical signals in a balanced photodetector to create the optically up-converted signal. Tx-PAA architectures including optical up-conversion can utilize the same two versions of optical combiner as in the non-optical up-conversions Tx-PAA, which are also used in the Rx-PAA architectures—either via an array photodetector device (i.e. a standard array or GAPC device) or via the use of WDM.

Tx-PAA systems support multiple applications, including radar and communications systems. The RF signals may be as simple as a single sinusoid, or a pulsed sinusoid, typical for radar system. For communications systems involving high-speed digital communications or 5G cellular systems, complex modulation formats may be utilized to fill the channel bandwidth more efficiently, e.g., with many digital cellular signals. RF modulation may be applied with any modulator technology; however, more linear modulation may be achieved with a Mach Zehnder interferometer (MZI) modulator, or a linearized version of an MZI modulator. Additionally, for more complex modulation such as high data rate communications and/or 5G cellular, an IQ modulator may be used, e.g., created from two MZI modulators in parallel—one MZI modulator providing the I channel, and another MZI modulator providing the Q channel. For up-converting Tx-PAA systems, the LO comprises a single sinusoid; however, this single sinusoid may be "jumped' from one frequency to another, or the frequency may be modulated with an arbitrary waveform, e.g., a triangular waveform of frequency versus time. Thus, a variation of frequency versus time for the transmitted RF frequency is provided. Such capabilities have utility and industrial applicability in radar systems.

An example PAA system for use in 5G cellular systems utilizes millimeter wave operating frequency bands at ~28 GHz or ~39 GHz, which have a bandwidth of around 2 GHz. A high performance digital to analog converter (DAC), or two DACs, if using an IQ modulator, could provide the analog drive signal(s) in a 2-4 GHz IF band, providing an optical signal with an Orthogonal Frequency Division Multiplexing (OFDM) modulation format which incorporates many digital cellular signals. The up-converting Tx-PAA up-converts the optical signal to the chosen millimeter wave band, e.g. 39 GHz+/−1 GHz, and, through chosen time delays and amplitude values to each antenna element, provides RF Beamforming for the millimeter wave signal. The multiple-channel simultaneous RF beamforming design allows for many RF beams to be generated simultaneously, directing each beam to a different cellular phone user or different groups of users. The return signal from the cellular phone user(s) is accessed by the Rx-PAA portion of the system. Multiple-channel simultaneous RF beamforming is used to receive many RF beams from different directions without interference, taking the complete 2 GHz band from each RF beam and down converting this to the 2-4 GHz IF band. A high performance analog to digital converter (ADC) then converts the full bandwidth into a digital signal for further processing. Using the novel photonic RF Beamforming PAA system, as further described herein, significantly facilitates the operation of a multiple RF beam system, carrying out the signal processing and beamforming directly in the Photonic PICs. This contrasts to the digital beamforming (DBF) approach, which requires transmission and processing of unrealistically high digital data rates in order to perform RF beamforming on systems having a plurality of antenna elements.

BRIEF DESCRIPTION OF THE DRAWINGS

FIG. 2. Example schematic for a Rx-PAA showing wafer-scaled Multiple Channel Simultaneous Beamforming—Photonic Integrated Circuit (MCSB-PIC) devices (modules) tiled across the back of the antenna; electrically connected to all antenna elements, each MCSB-PIC supporting 8×8 antenna elements (16 MCSB-PICs total).

Figure 10:
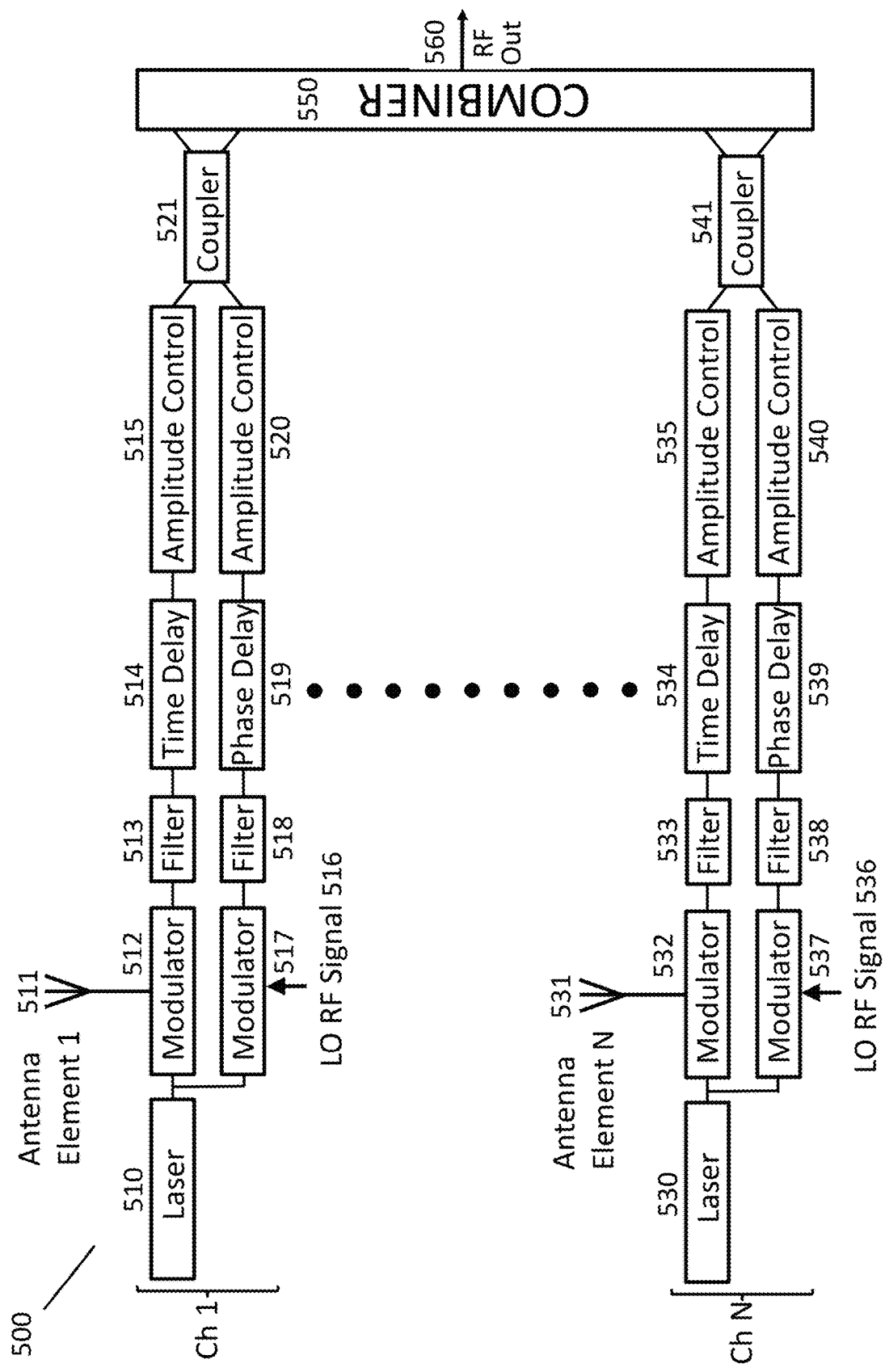

FIG. 10. Rx-PAA system with optical down-conversion using 1 laser which is power split to provide both the antenna signal and LO signal. The optical LO signal is obtained by modulating the laser carrier with an RF LO signal, then filtering off the required optical LO signal.

Figure 11:
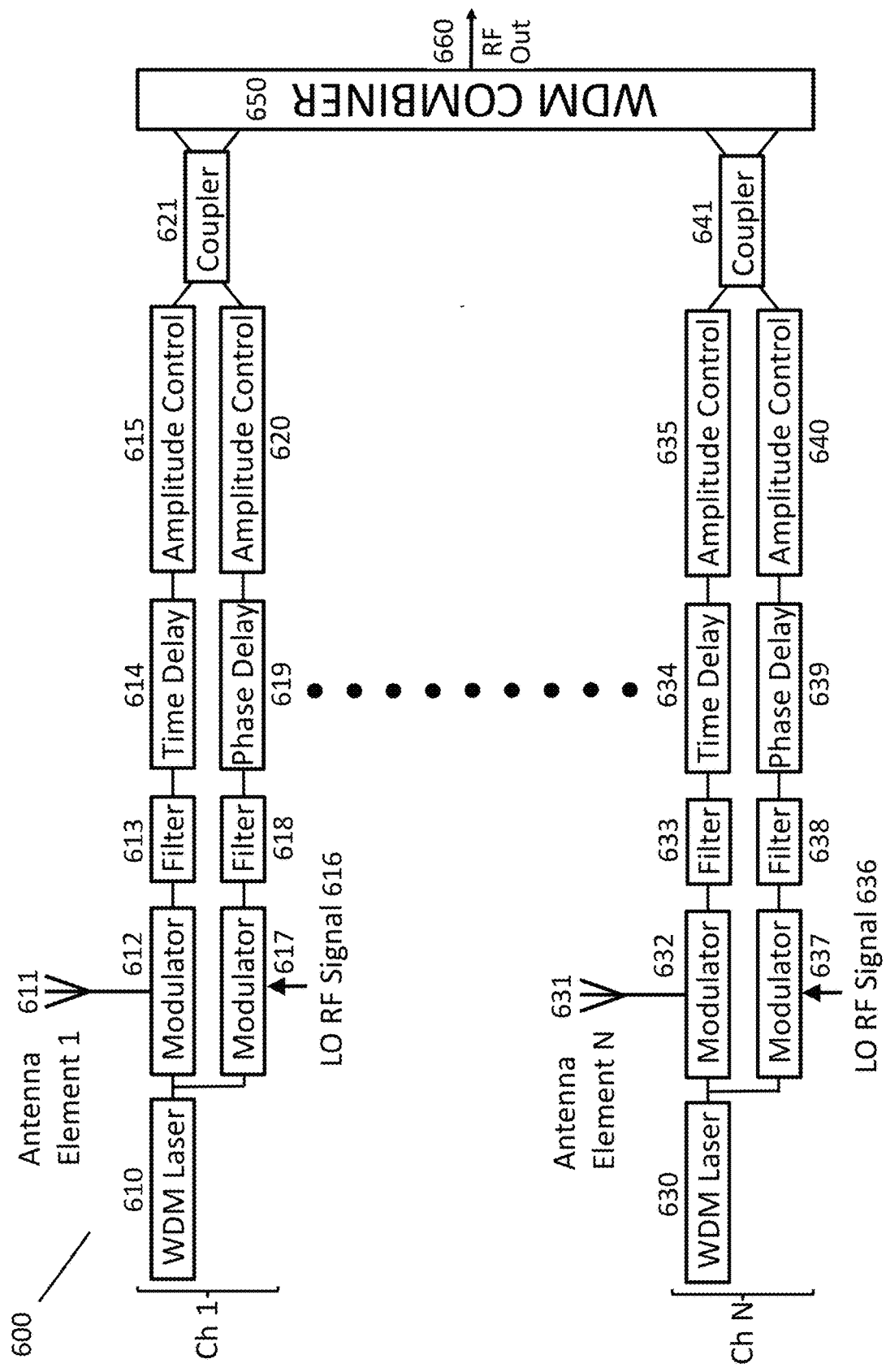

FIG. 11. MCSB-PIC design using wavelength division multiplexing (WDM) for signal combining. The optical multiplexed signal can leave the MCSB-PIC for 2 stage multiplexing, or a photodetector (or differential pair of photodetectors) on the MCSB-PIC can convert the multiplexed optical signal to a single electrical signal.

Figure 12:
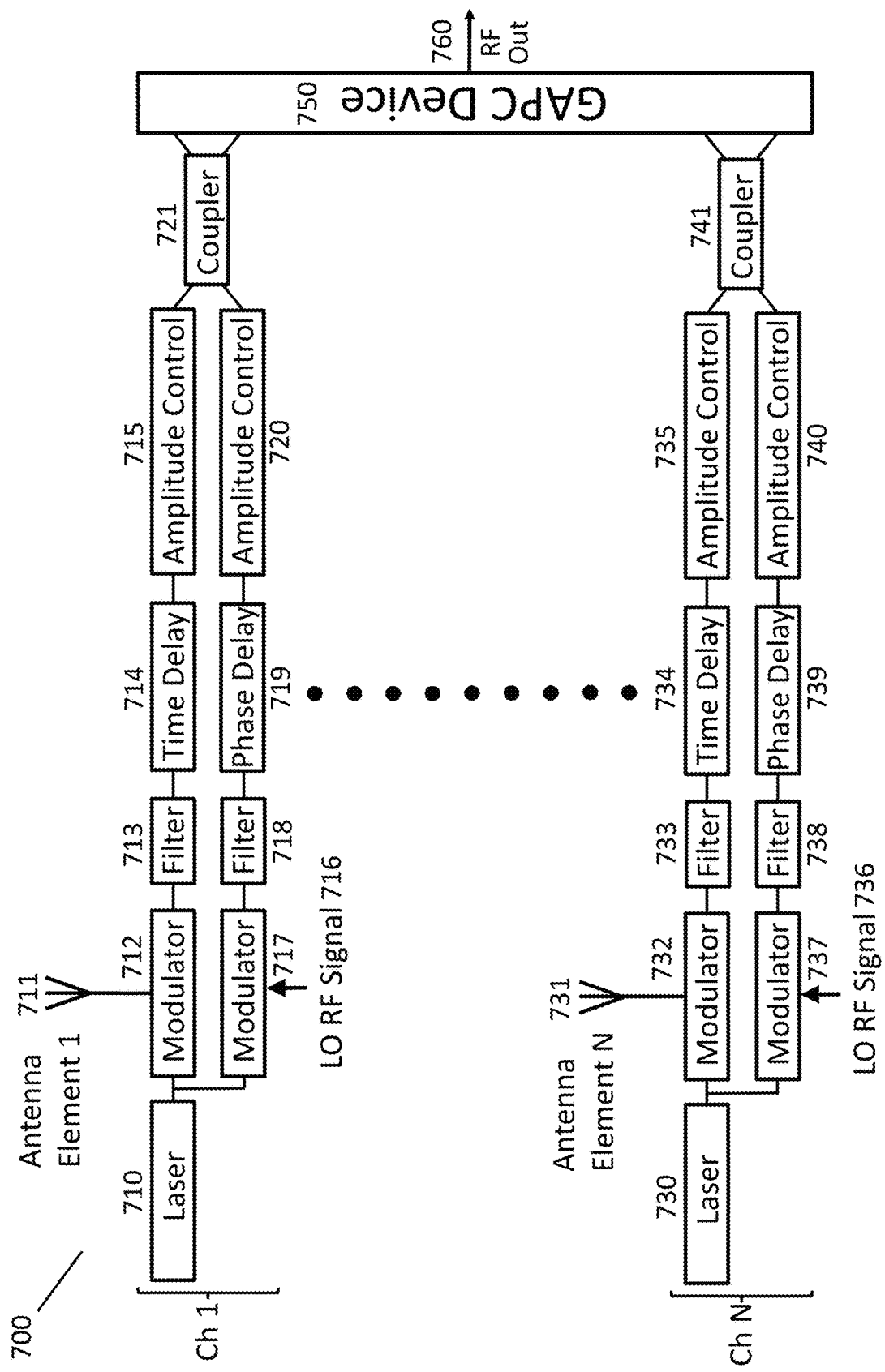

FIG. 12. MCSB-PIC using a single GAPC device for signal combining, providing a single electrical output.

Figure 13:
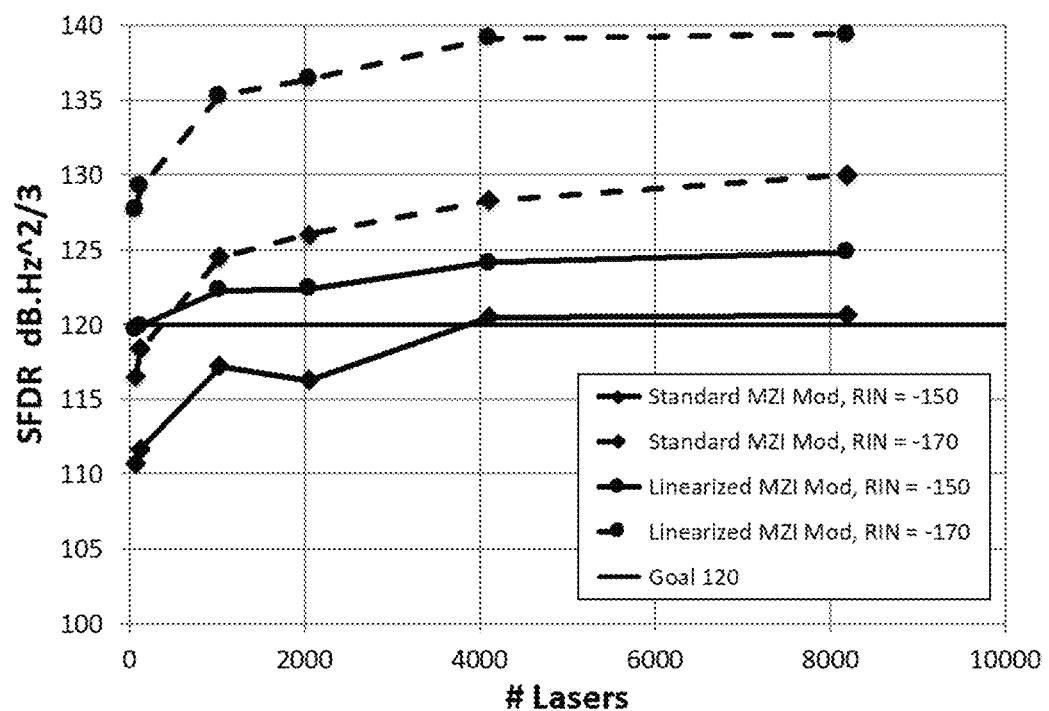

FIG. 13. Simulated spurious free dynamic range (SFDR) versus the number of lasers multiplexed together in the Rx-PAA system (1 or 2 lasers per antenna element). These simulations compare the Rx-PAA system SFDR using either a standard Mach Zehnder interferometer (MZI) modulator or a Linearized MZI modulator, and also using a laser with standard relative intensity noise (RIN) of −150 dB/Hz, or low RIN of −170 dB/Hz. A goal for SFDR of 120 dB·Hz$^{2/3}$ is included in the plot.

Figure 14:
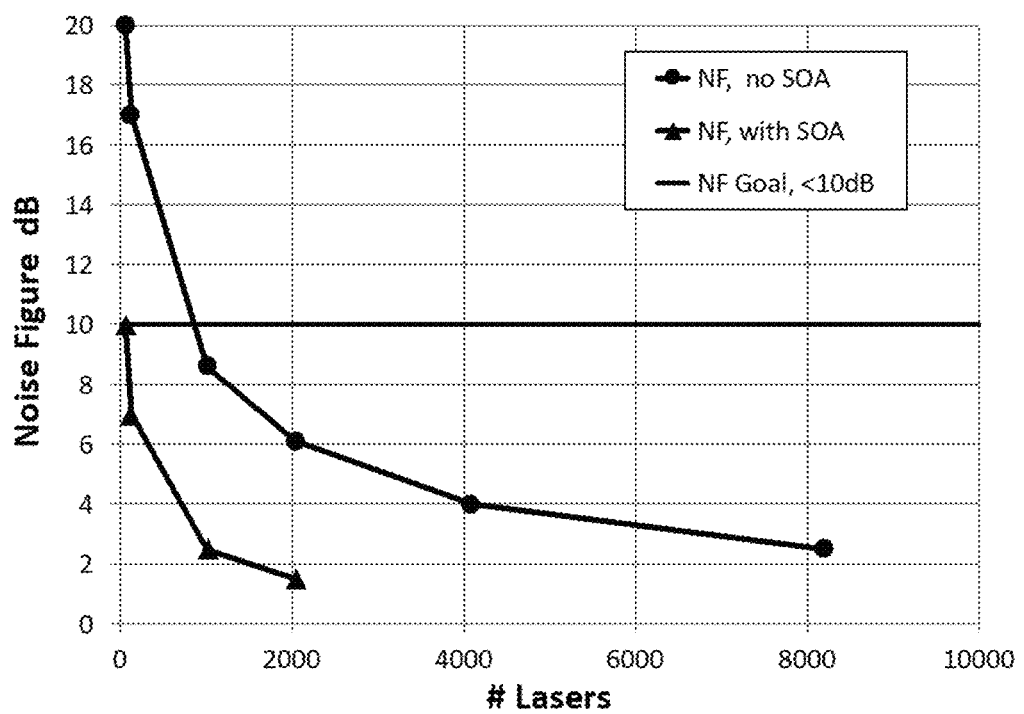

FIG. 14. Simulated noise figure (NF) versus the number of lasers multiplexed together in the Rx-PAA system (1 or 2 lasers per antenna element). The NF is shown for the Rx-PAA system shown in FIG. 3, the system without a semiconductor optical amplifier (SOA), and also for a design including an SOA following each antenna modulator in order to increase the photonic signal level.

Figure 15:
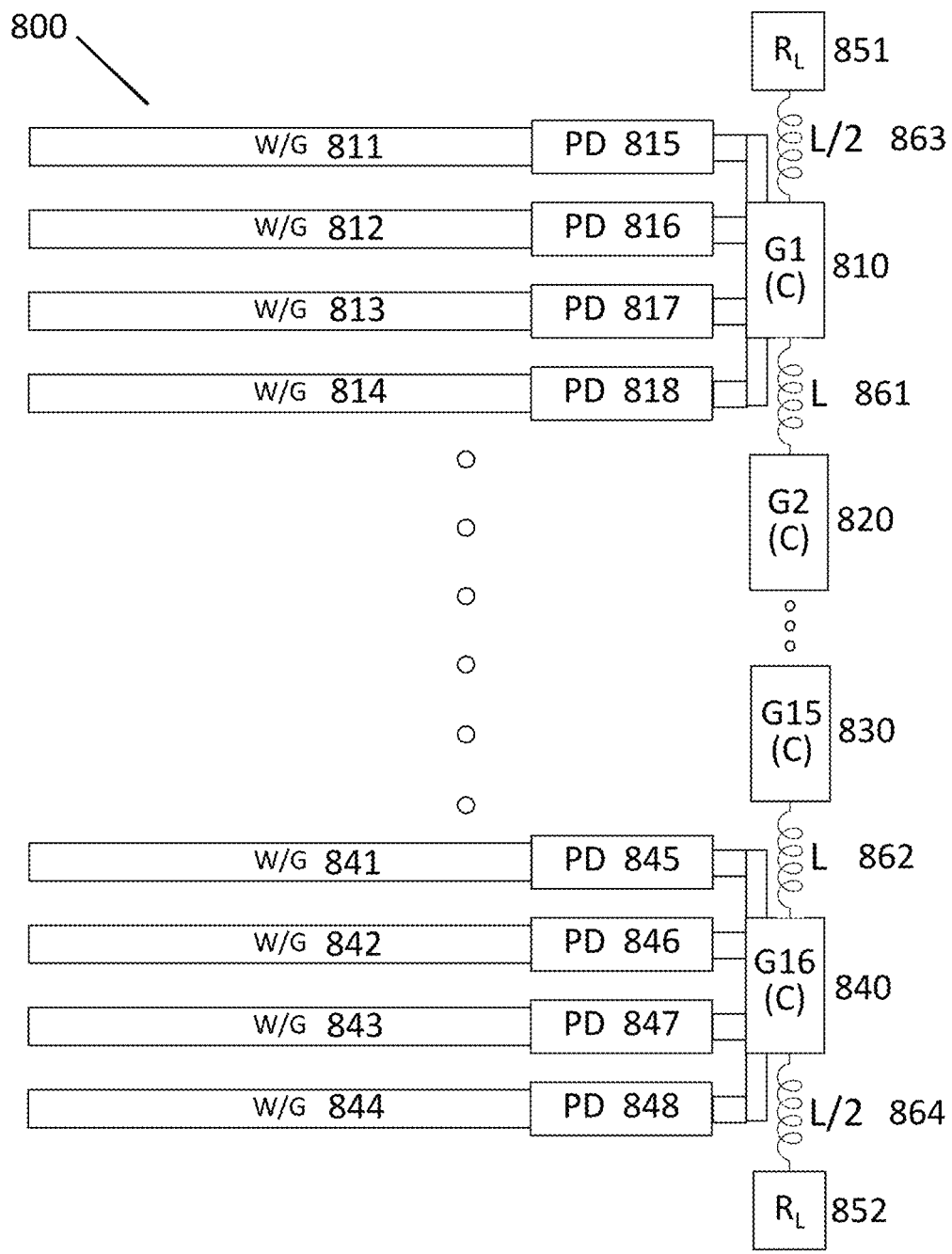

FIG. 15. Schematic of a 64 photodetector GAPC made from 16 Groups of 4 photodetectors. The equivalent circuit for the GAPC includes a capacitance for the Group of photodetectors, C, (plus internal resistance), plus the inductors L and L/2 chosen to create an artificial transmission line.

Figure 16:
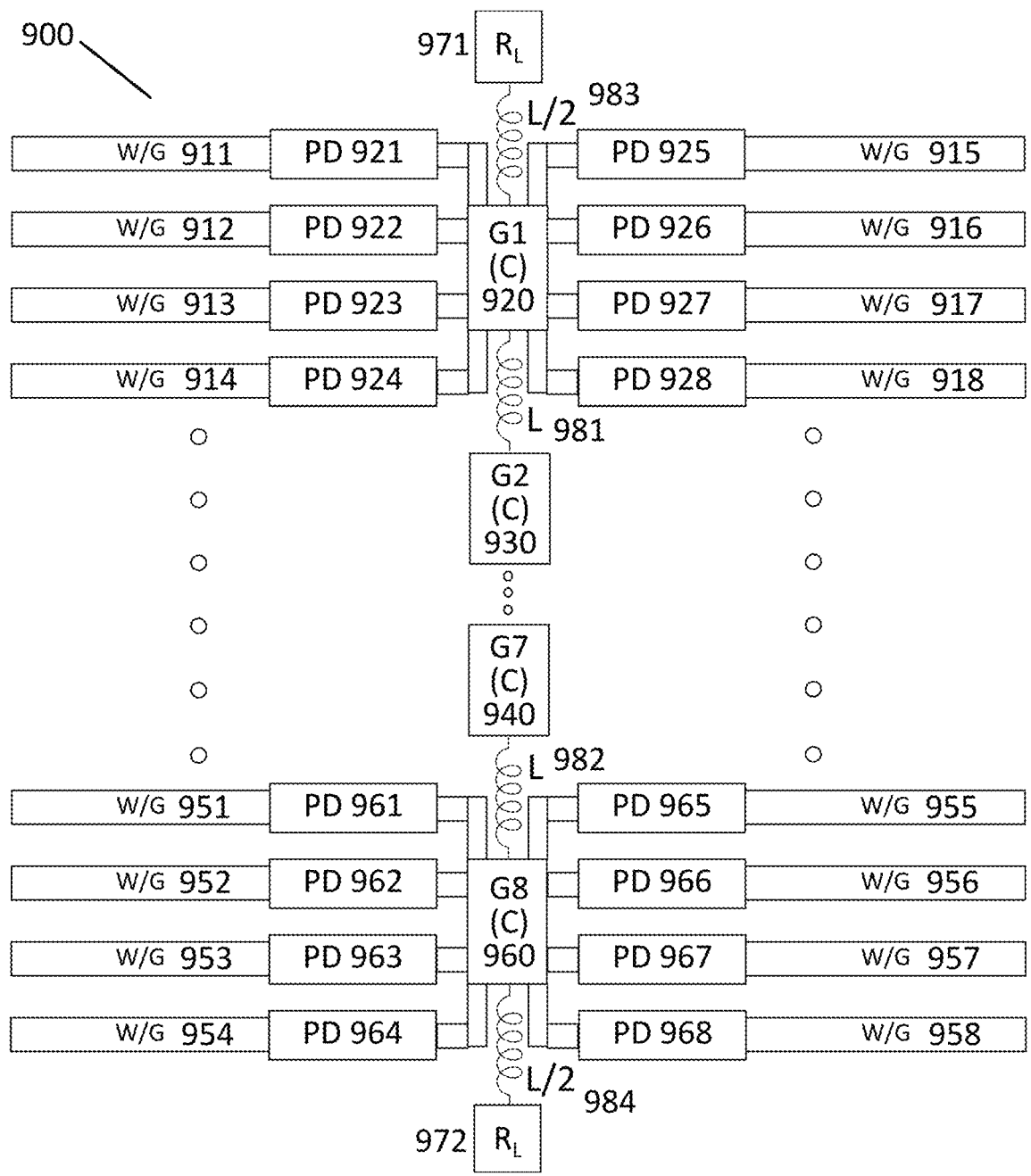

FIG. 16. Schematic of a 64 photodetector GAPC made from 8 Groups of 8 photodetectors. The equivalent circuit for the GAPC includes a capacitance for the Group of photodetectors, C, (plus internal resistance), plus the inductors L and L/2 chosen to create an artificial transmission line.

Figure 17:
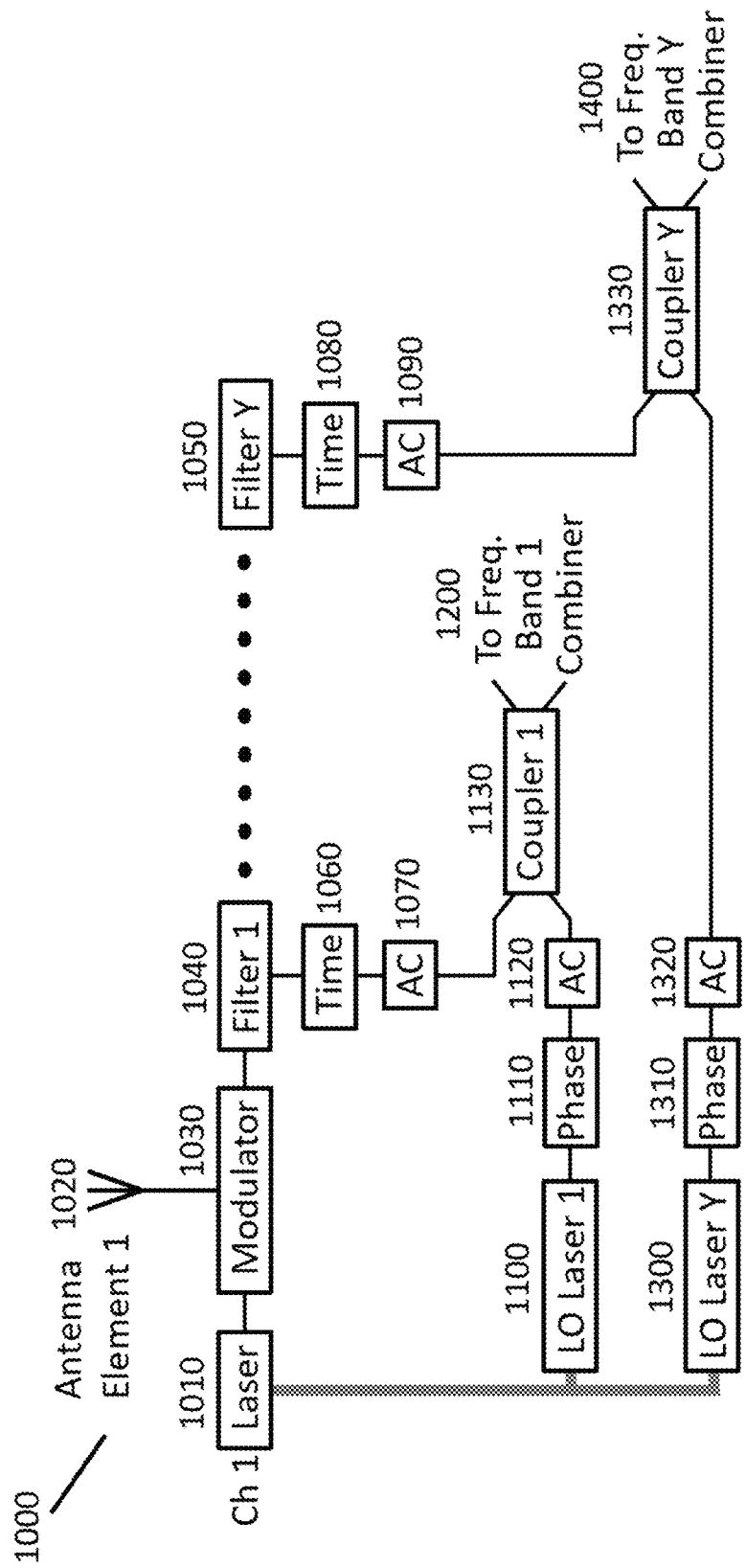

FIG. 17. Shows the extension from a single tunable down-converted channel, which can be used as a tunable single frequency band channelizer, to a multiple tunable frequency band channelizer (in the limit all frequency bands can be down-converted making a full coverage channelizer). In this schematic, only a single optical channel (of N channels) is shown.

Figure 18:
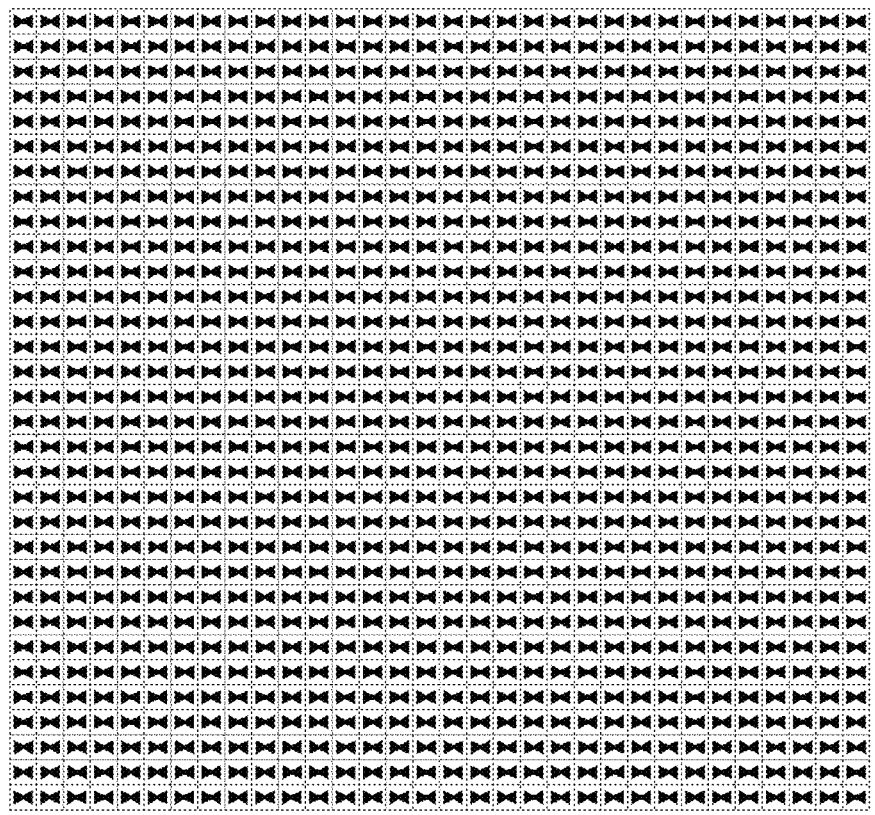

FIG. 18. Prior Art example schematic for a Transmit Phased Array Antenna (Tx-PAA) showing the antenna side with 32×32 (1024 total) bowtie shaped antenna elements.

Figure 19:
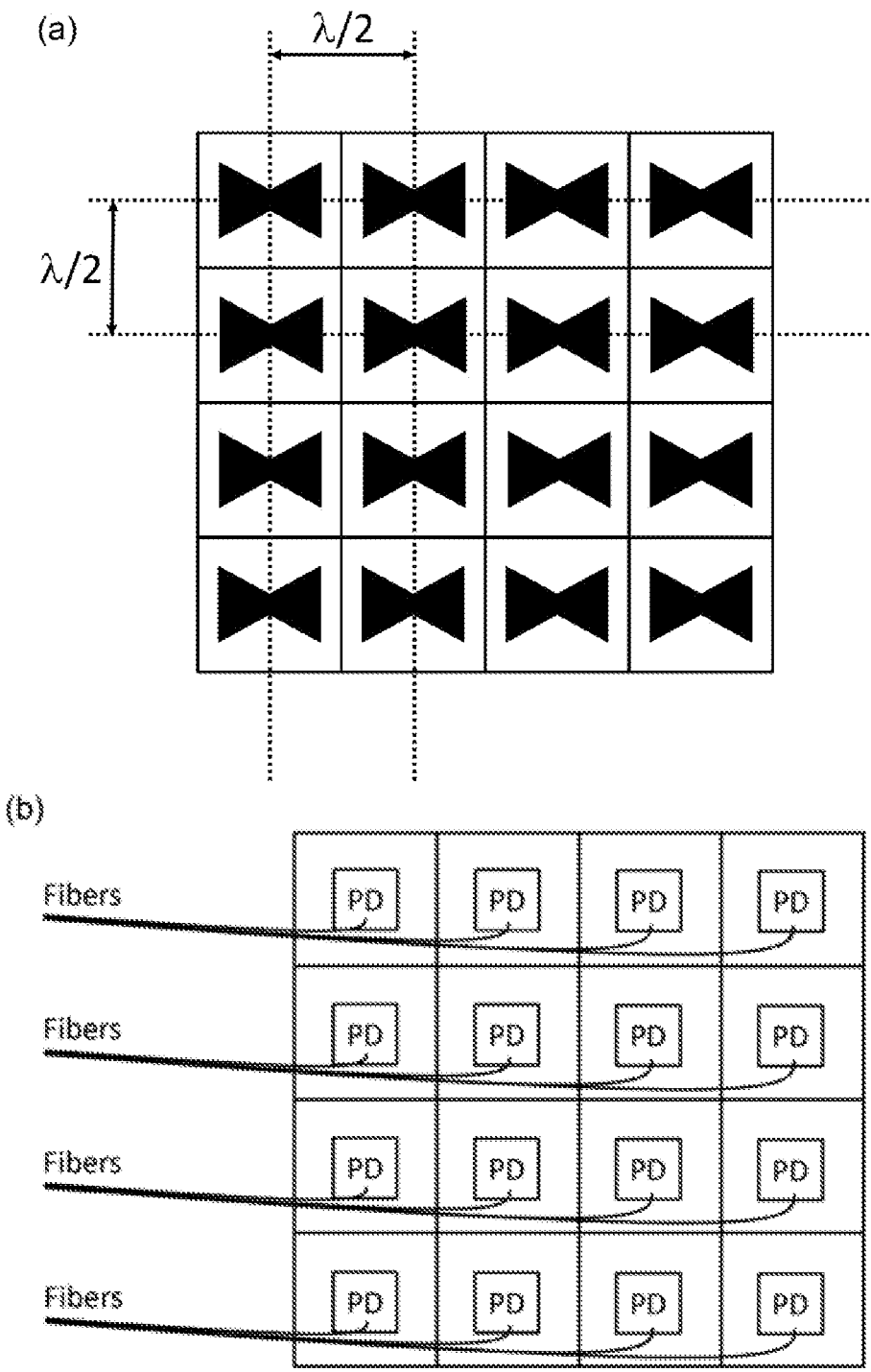

FIG. 19. Prior art examples of (a) a 4×4 sub-array of antenna elements, each separated by λ/2 at the maximum operating frequency of the antenna, and (b) the back of such a sub-array showing a photodetector driving each of the antenna elements (this may include an electronic power amplifier, PA, between the photodetector and antenna element), with an optical fiber providing the optical signal to each photodetector.

Figure 20:
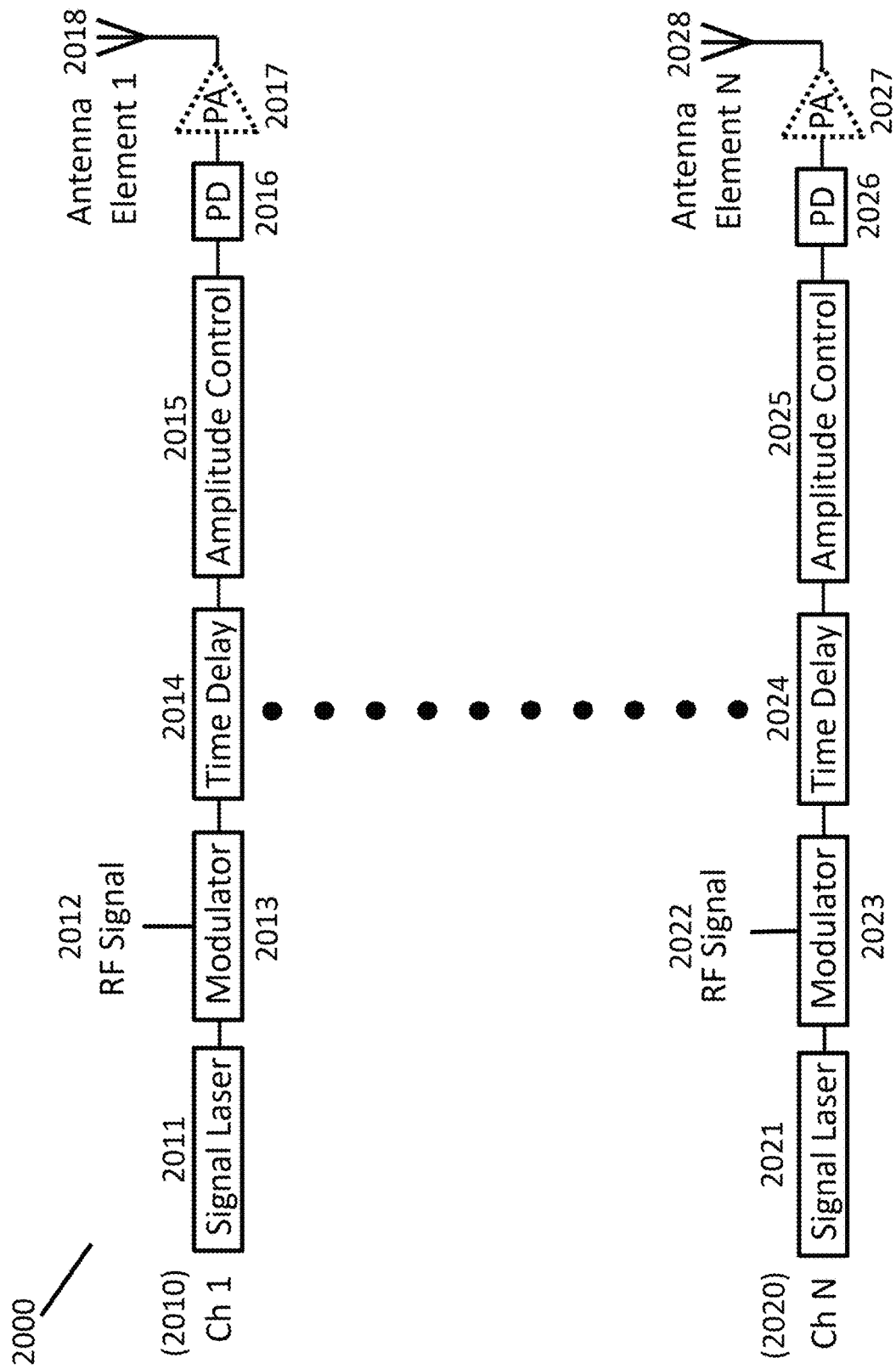

FIG. 20. Basic Tx-PAA system design schematic. One laser and signal channel per antenna element; the laser carrier is modulated by an electrical transmit RF signal; this optical signal is time delayed and amplitude controlled, then converted to an electrical signal to drive the antenna element (with an optional power amplifier, PA, positioned between the photodetector and the antenna element).

Figure 21:
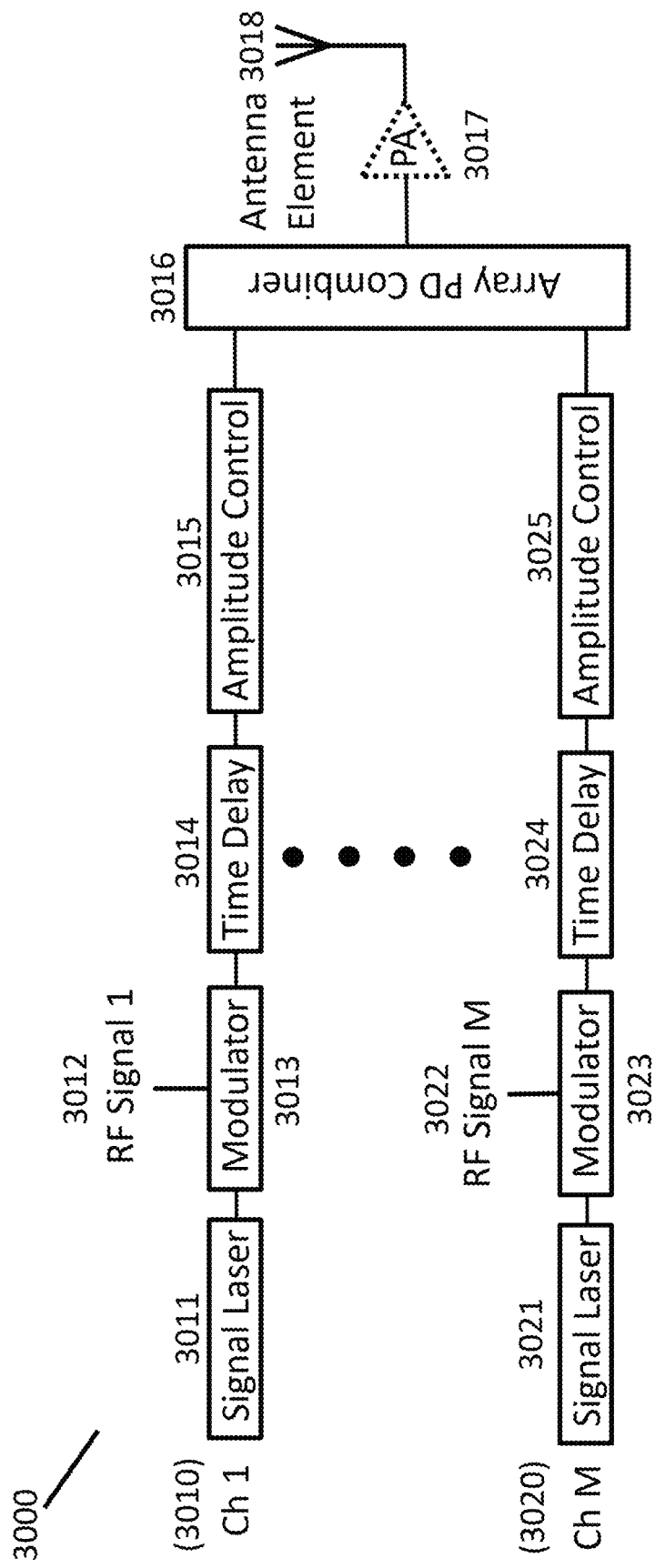

FIG. 21. Illustrates the use of multiple laser/signal channels per antenna element, using an array photodetector combiner (or GAPC device) to combine all of the optical signals into a single electrical output. The electrical output signal of the array photodetector combiner drives the antenna element, with an optional PA. The multiple lasers/signal channels provide multiple-channel simultaneous RF beamforming for the Tx-PAA. Alternatively, the multiple lasers/signal channels comprise the same signal on all channels in order to provide a higher electrical output via increased optical gain.

Figure 22:
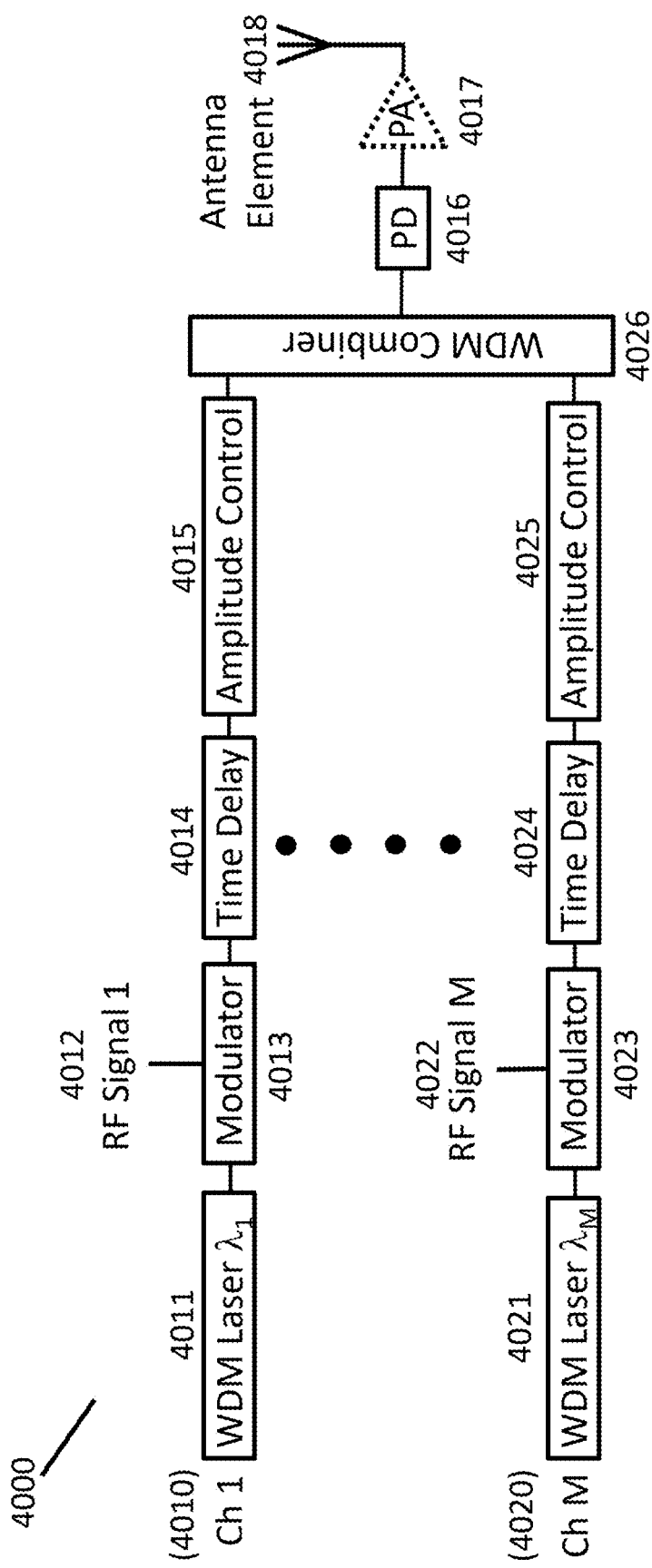

FIG. 22. Illustrates the use of multiple WDM laser/signal channels per antenna element, using a WDM combiner/multiplexer to combine all of the optical signals into a single optical signal going into the single photodetector. The photodetector electrical output drives the antenna element, with an optional PA.

Figure 23:
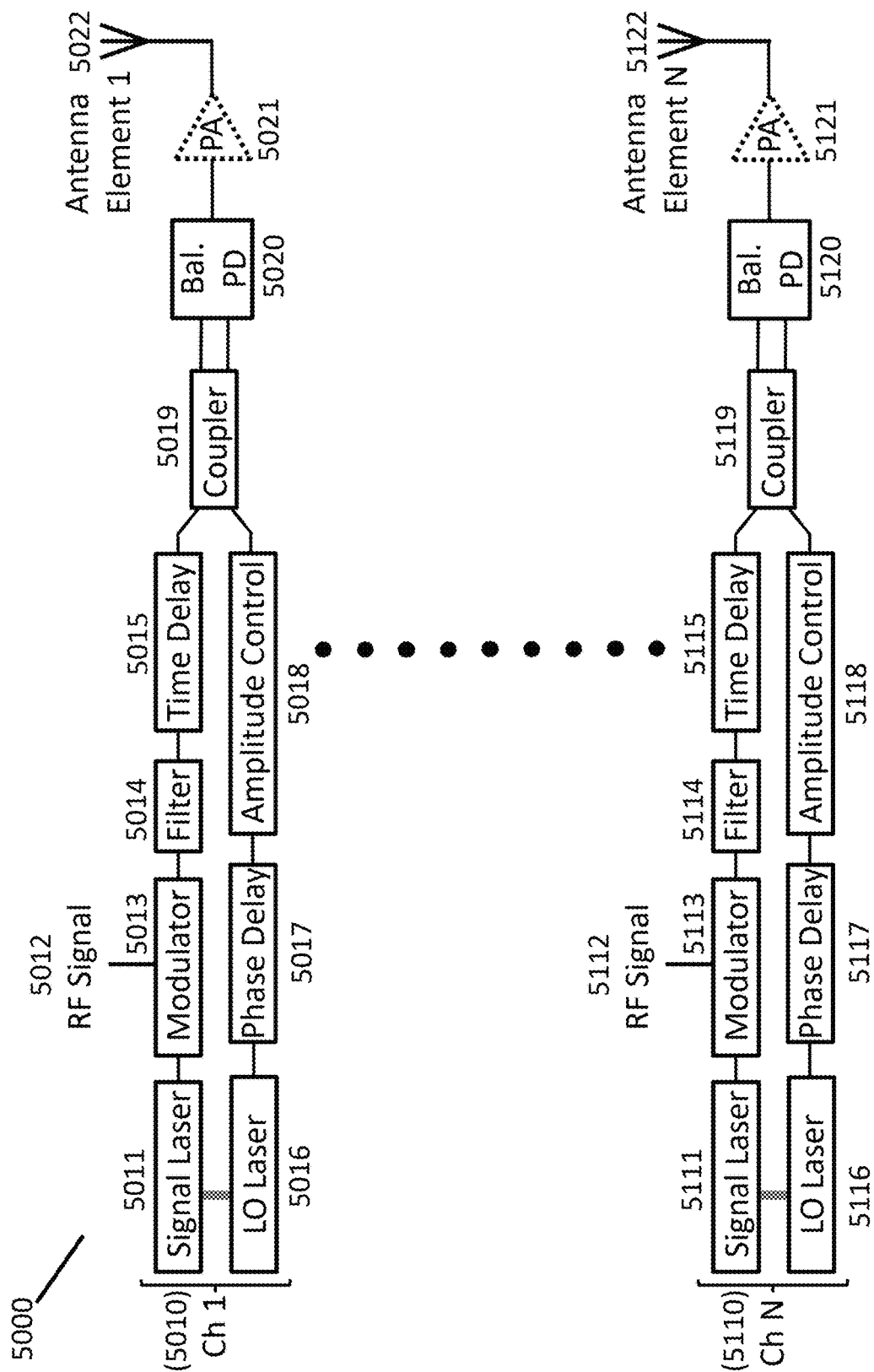

FIG. 23. Illustrates a Tx-PAA system including optical up-conversion, taking a baseband RF signal (e.g., from a DAC) and up-converting this signal to the required transmit frequency. This design employs two locked lasers per channel—one laser for the optical RF signal and one laser for the optical Local Oscillator (LO) signal used for up-conversion. The optical RF signal and the optical LO signal are combined in a directional coupler, said directional coupler providing two optical outputs that feed into a balanced photodetector. The balanced photodetector electrical output drives the antenna element, with an optional PA. A balanced photodetector is a pair of two similar or identical photodetectors wired as a differential pair. Similarly, a balanced array photodetector comprises 2 arrays of photodetectors wired as a differential pair. A balanced GAPC device comprises 2 GAPC devices wired as a differential pair.

Figure 24:
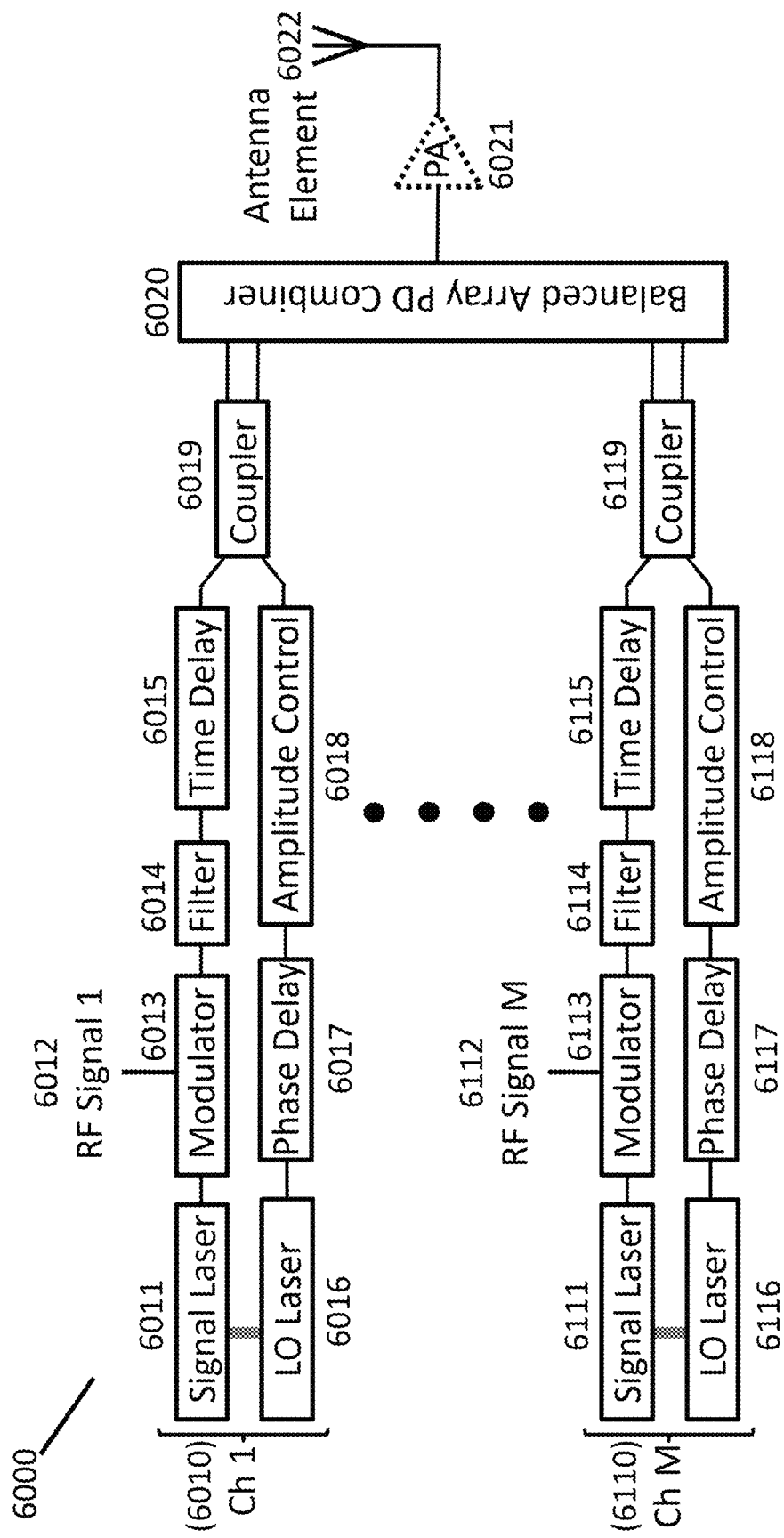

FIG. 24. Illustrates the use of multiple optically up-converted channels per antenna element, using a balanced array photodetector combiner (or balanced-GAPC device) to combine all of the optical signals into a single electrical output. The electrical output signal of the array photodetector combiner drives the antenna element, with an optional PA. The multiple up-converted channels provide multiple RF beamforming for the Tx-PAA. Alternatively, the multiple up-converted channels comprise the same signal on all channels in order to provide a higher electrical output via increased optical gain.

Figure 25:
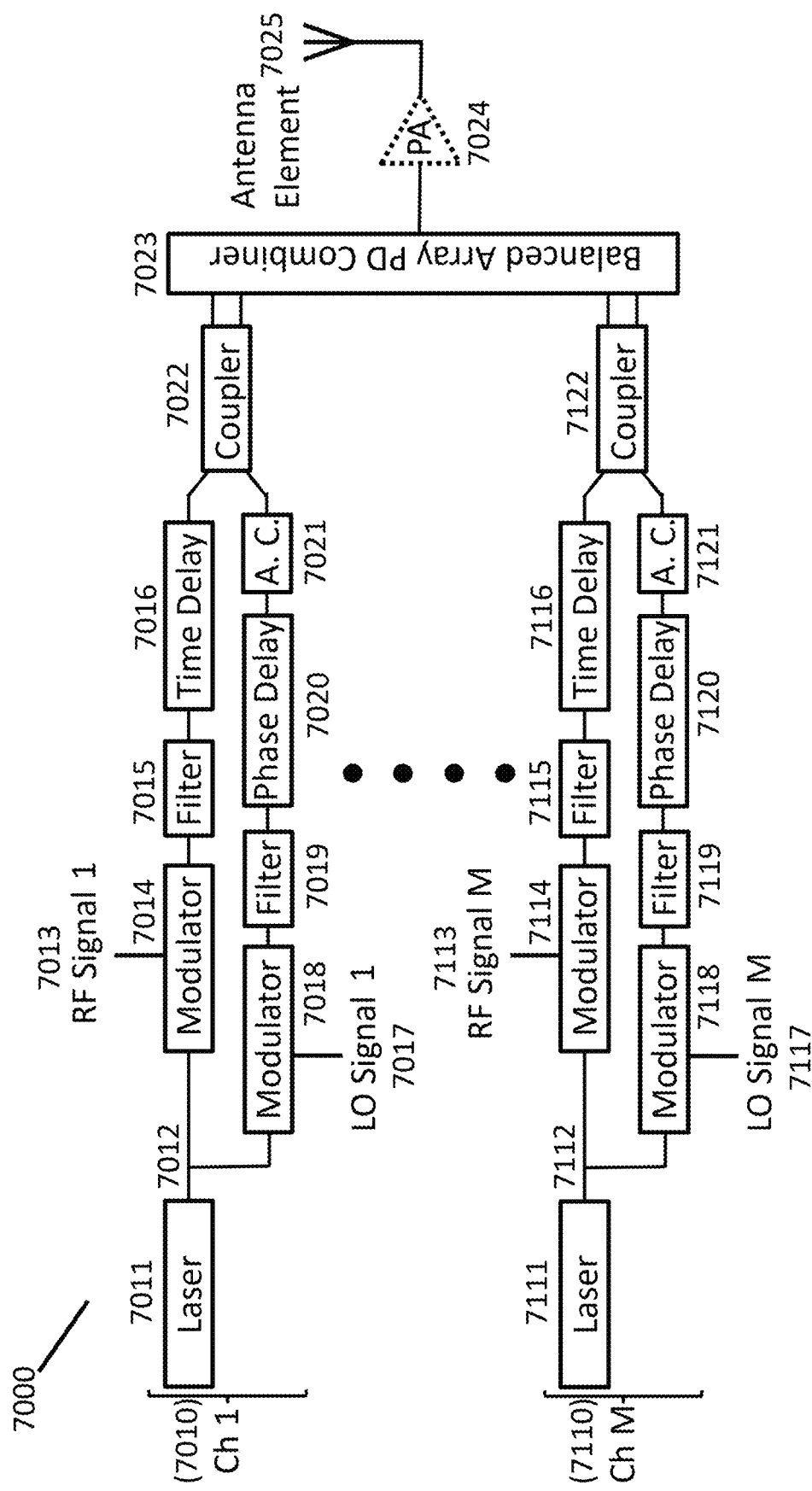

FIG. 25. A Tx-PAA system with optical up-conversion using one laser that is power split to provide both the optical RF signal and the optical LO signal. The optical LO signal is obtained by modulating the laser carrier with an RF LO signal, then filtering out the required optical LO signal.

Figure 26:
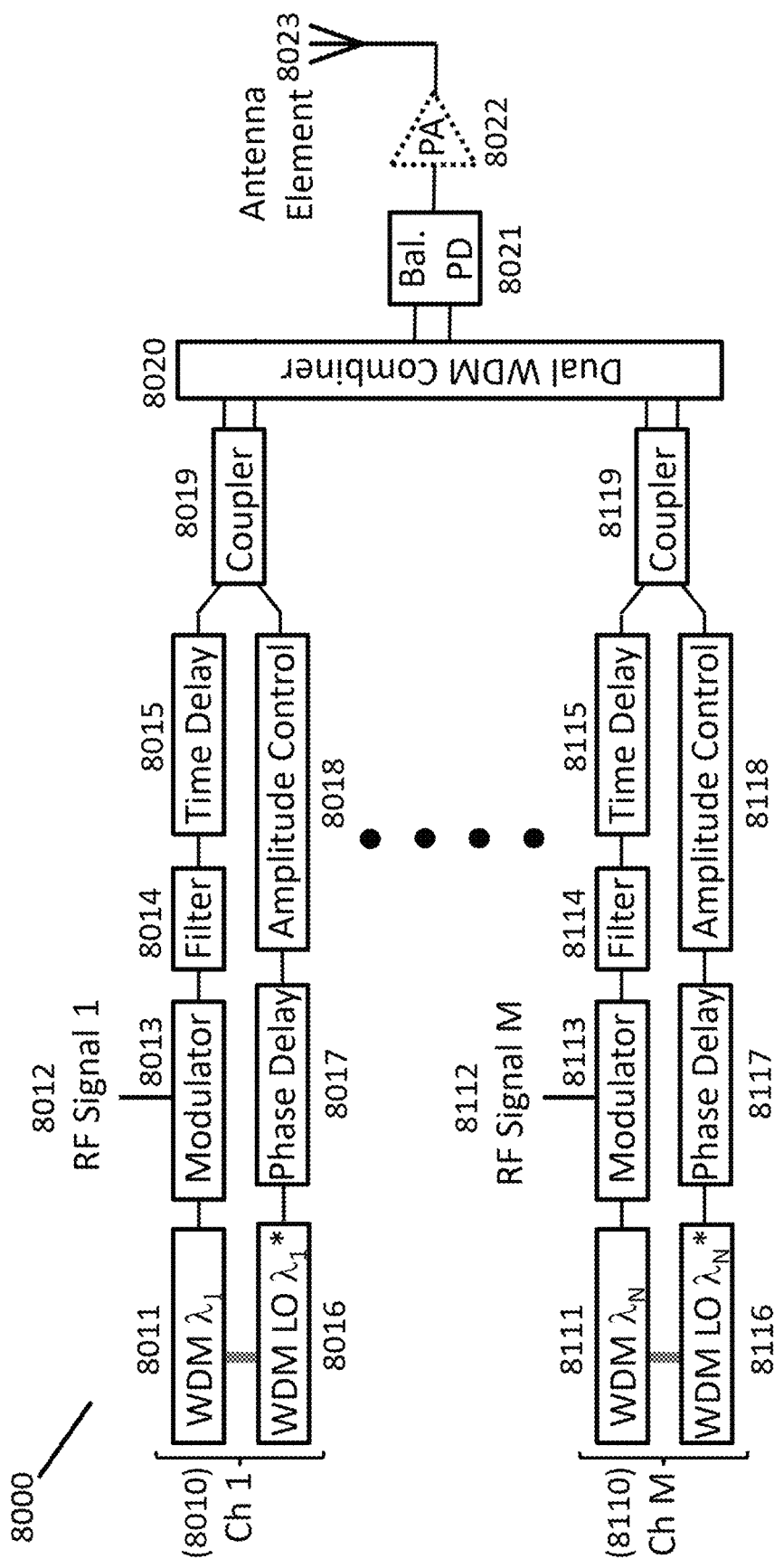

FIG. 26. Illustrates the use of multiple WDM optically up-converted channels per antenna element, using a dual WDM combiner/multiplexer to combine all of the optical signals into two optical signals going into a balanced photodetector. This up-converter design uses two locked lasers per channel, one for the optical RF signal and one for the optical LO signal. The photodetector electrical output drives the antenna element, with an optional PA.

Figure 27:
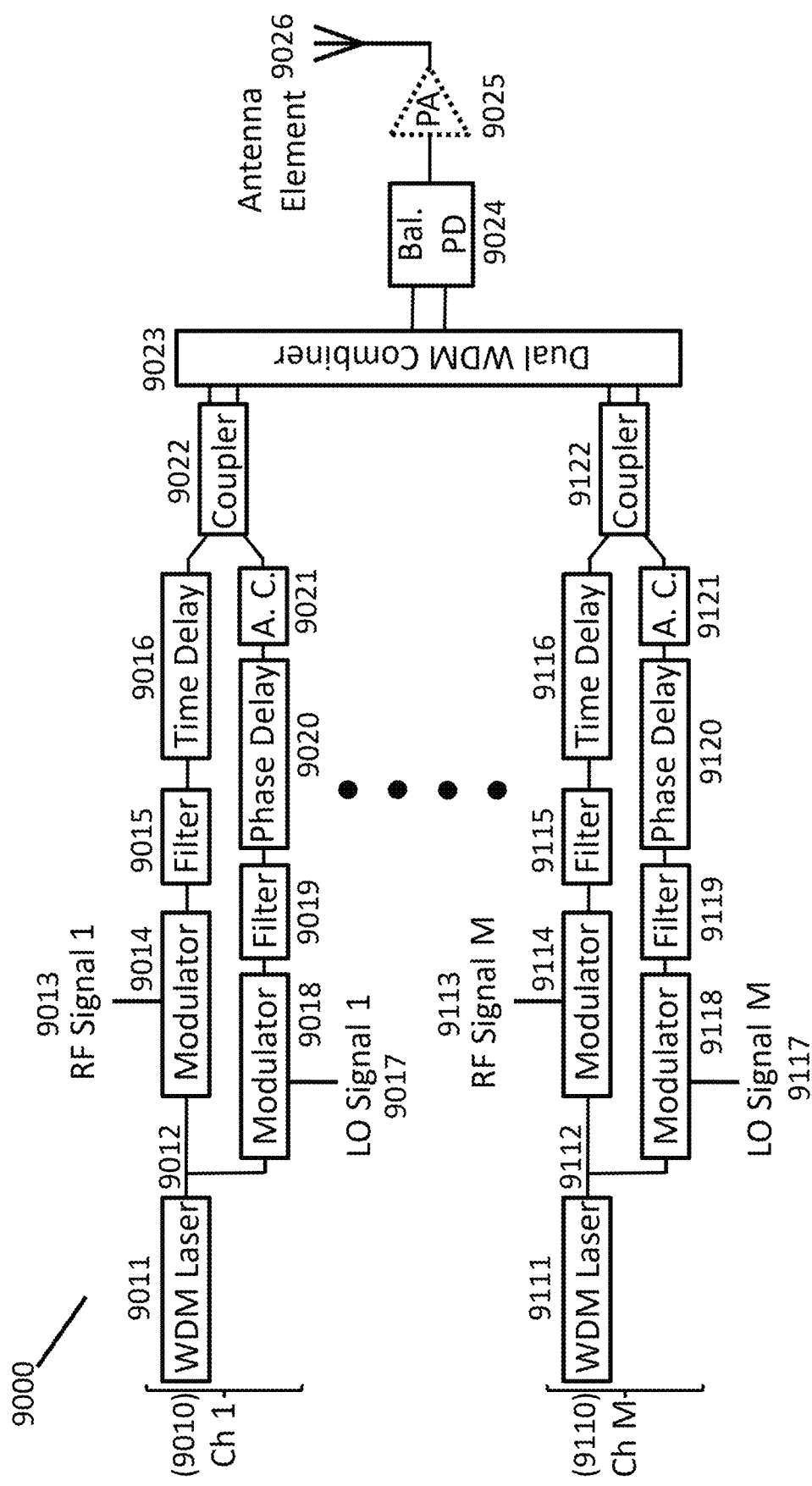

FIG. 27. Illustrates the use of multiple WDM optically up-converted channels per antenna element. Such an up-converter design uses one WDM laser that is power split to provide both the optical RF signal and the optical LO signal. The optical LO signal is obtained by modulating the laser carrier with an RF LO signal, then filtering out the required optical LO signal. The two outputs of each WDM channel are combined in a dual WDM combiner, feeding into a balanced photodetector. The photodetector electrical output drives the antenna element, with an optional PA.

Figure 28:
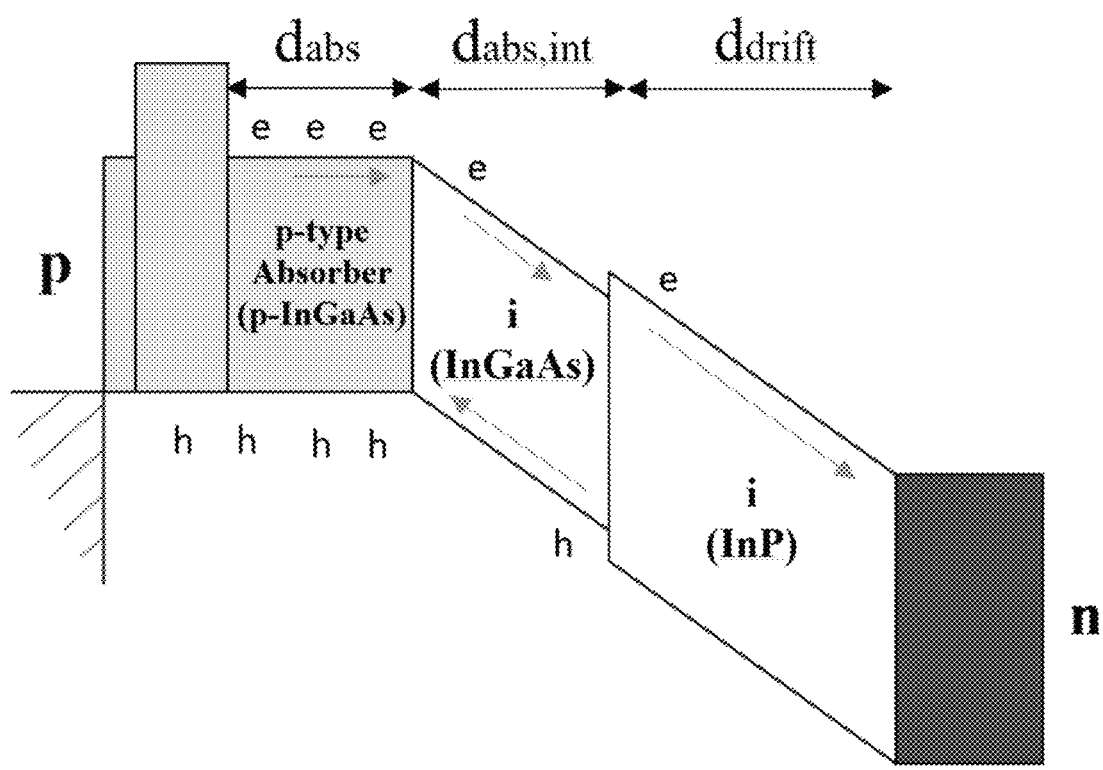

FIG. 28. The Prior Art energy diagram of a Modified Uni-Traveling Carrier (MUTC) photodetector, showing the depleted absorber layers, $d_{abs}$ and $d_{abs,int}$, and the depleted drift layer, $d_{drift}$. The depletion width thickness equals the combined thickness of these three layers, $d_{abs}+d_{abs,int}+d_{drift}$.

FIG. 29. Table comparing the transit time bandwidth, parasitic bandwidth, and total bandwidth of a single photodetector, an 8 photodetector array, and a 32 photodetector array, for three MUTC photodetector designs; 1) Prior Art MUTC photodetector design with 1.1 μm depletion width, 2) Extended Transit Time MUTC photodetector design with 2 μm depletion width, and 3) Extended Transit Time MUTC photodetector design with 4 μm depletion width.

DETAILED DESCRIPTION OF THE PREFERRED EMBODIMENTS

Figure 1:
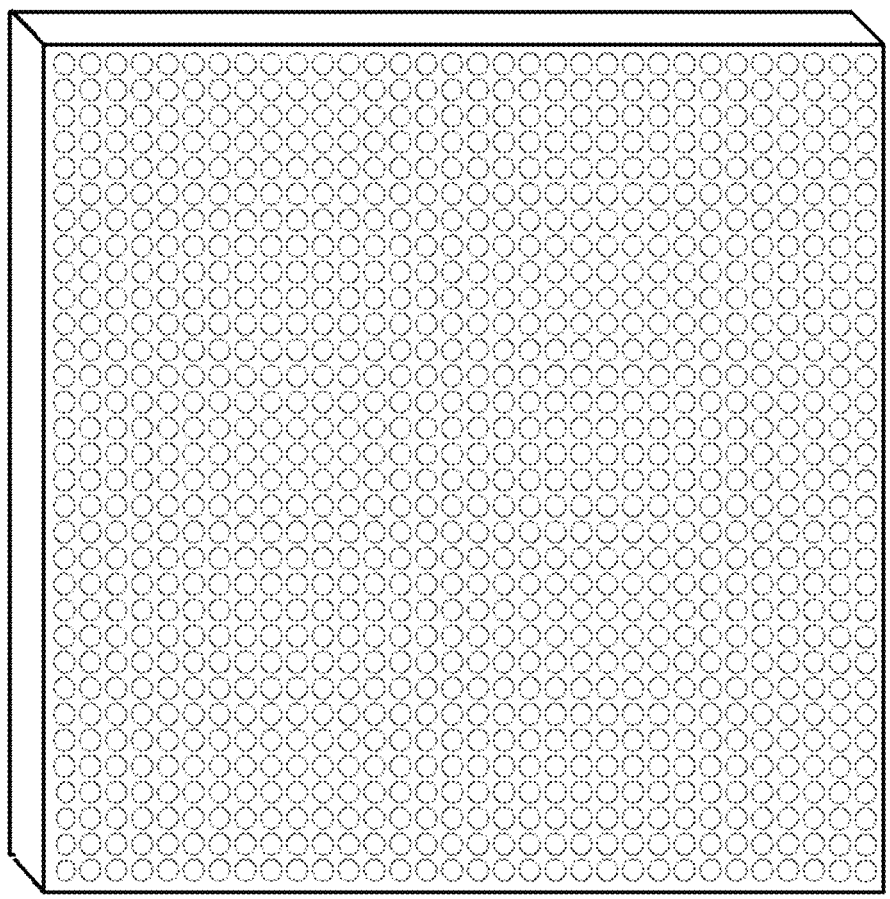
FIG. 1. Example schematic for a Receive Phased Array Antenna (Rx-PAA) showing the antenna side with 32×32 (1024 total) antenna elements.

The embodiment of the Rx-PAA shown in FIGS. 1 and 2 is an example that uses 16 MCSB-PIC modules tiled across the back of an antenna, each MCSB-PIC supporting 64 antenna elements (8×8), with all 16 devices supporting the 1024 element (32×32) PAA. The large size (wafer scale) devices can provide all the required functionality for 64 antenna elements within a single PIC. RF connections are made through the antenna from each antenna element to the appropriate modulator on each MCSB-PIC.

Figure 3:
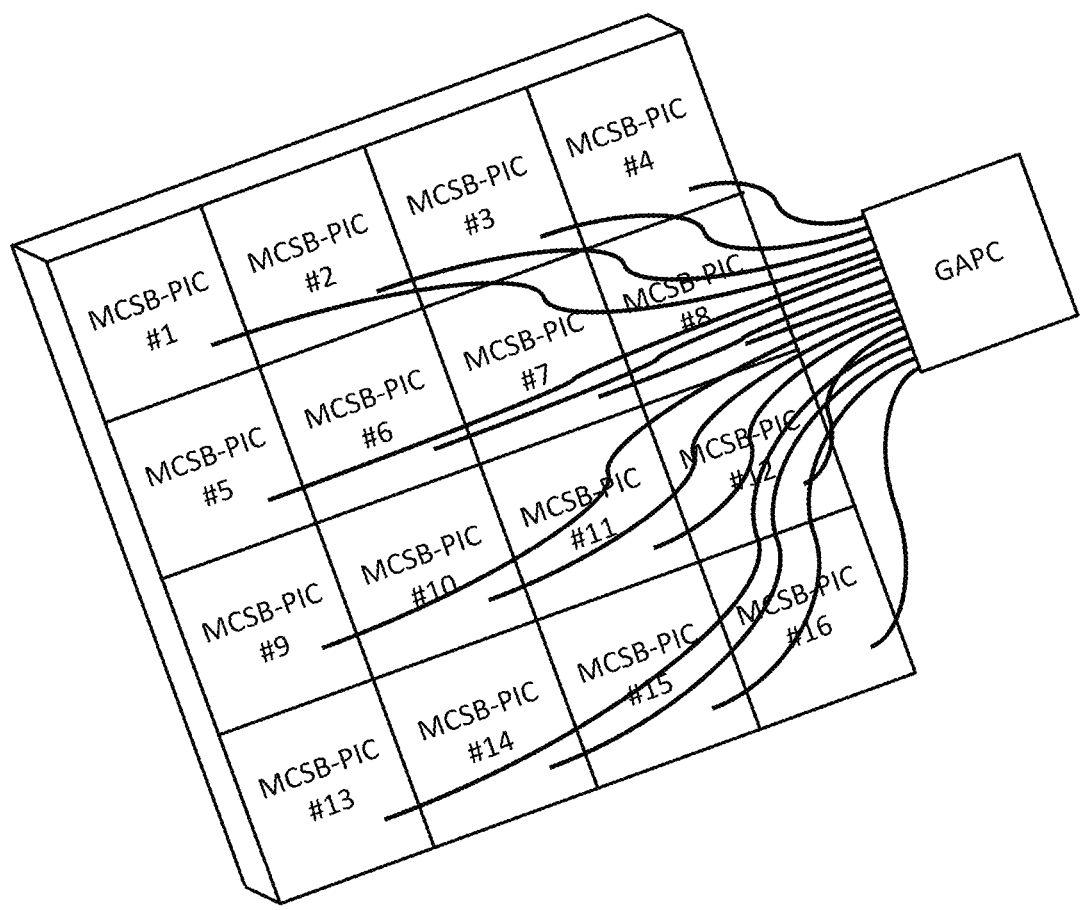
FIG. 3. Rx-PAA system utilizing two stage optical multiplexing; wavelength division multiplexing (WDM) on the first stage followed by a Group Array Photodetector Combiner (GAPC) for the second stage.

FIG. 3 shows the Full Optical System, which includes wavelength multiplexing within each MCSB-PIC device to provide a single optical output per beamforming channel, the outputs from all MCSB-PIC devices for each channel being combined in the second stage of optical multiplexing in an array photodetector, such as the proposed GAPC device. WDM on the MCSB-PIC allows the combination of 64 signals, separated in wavelength to avoid noise due to overlapping channels interfering with each other. The array multiplexing for the second stage keeps the WDM signals from each MCSB-PIC on separate photodetector elements, again to eliminate possible interference effects.

Figure 4:
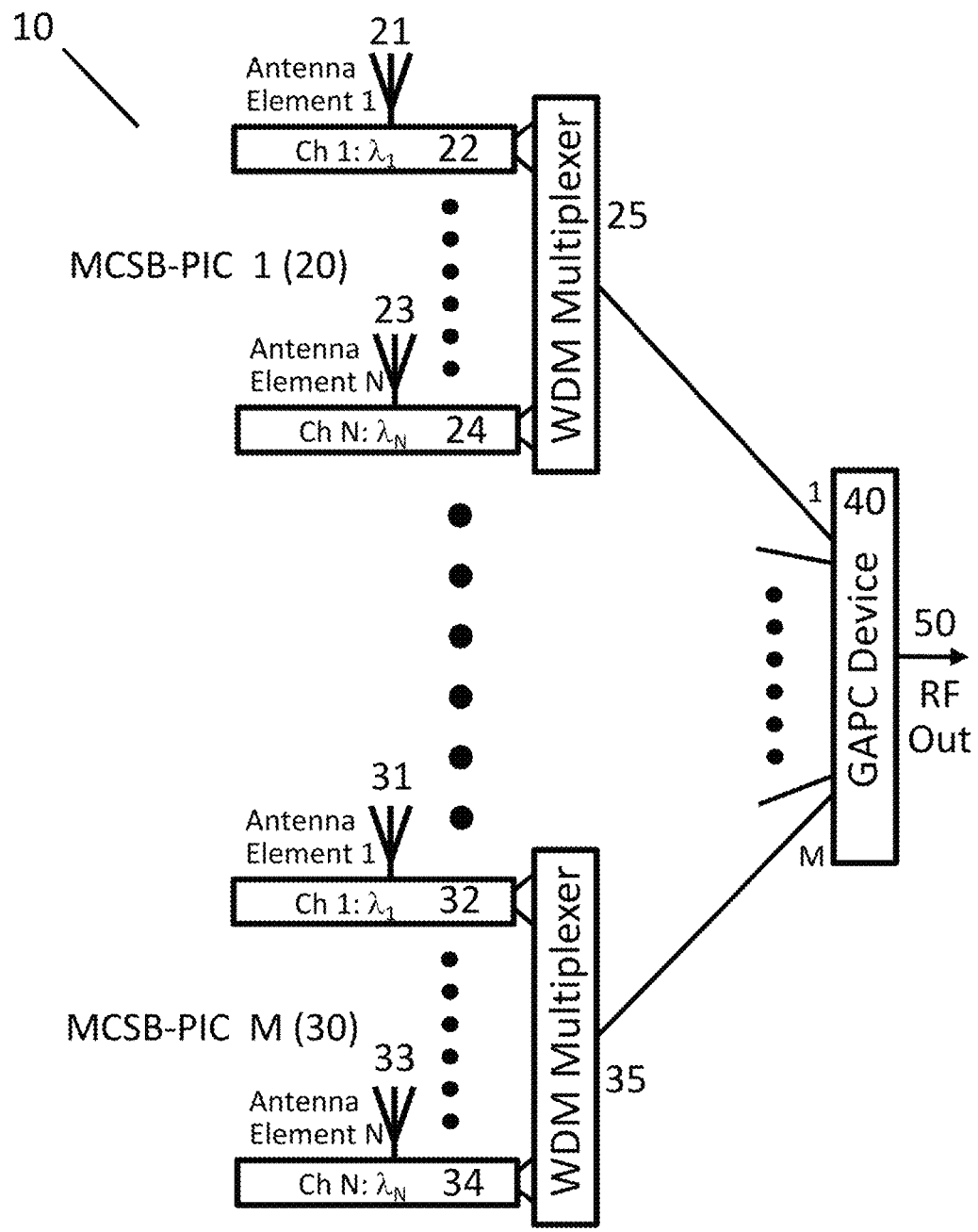
FIG. 4. Schematic of two stage optical multiplexing system, using WDM to combine N optical signals from N antenna elements (for each MCSB-PIC), followed by a GAPC to combine the M multiplexed signals from M separate MCSB-PICs.

A schematic of the 2 stage multiplexing scheme 10 is shown in FIG. 4. Within the first MCSB-PIC, 20, signals from antenna elements 21 and 23 drive the associated wavelength specific channels 22 and 24, the outputs from all channels on the MCSB-PIC 20 being combined in a wavelength division multiplexer 25. Multiple MCSB-PICs form the Rx-PAA system. The final, $M^{th}$ MCSB-PIC, 30, uses signals from antenna elements 31 and 33 to drive the associated wavelength specific channels 32 and 34, the outputs from all channels on this MCSB-PIC 30 being combined in a wavelength division multiplexer 35. Each MCSB-PIC has one optical output per simultaneous beamforming channel, although only one channel is shown in FIG. 4. The outputs from all MCSB-PIC devices for a specific simultaneous beamforming channel are combined within the GAPC device 40, providing a single RF output per simultaneous beamforming channel 50. The GAPC device combines outputs from M MCSB-PIC devices.

Figure 5:
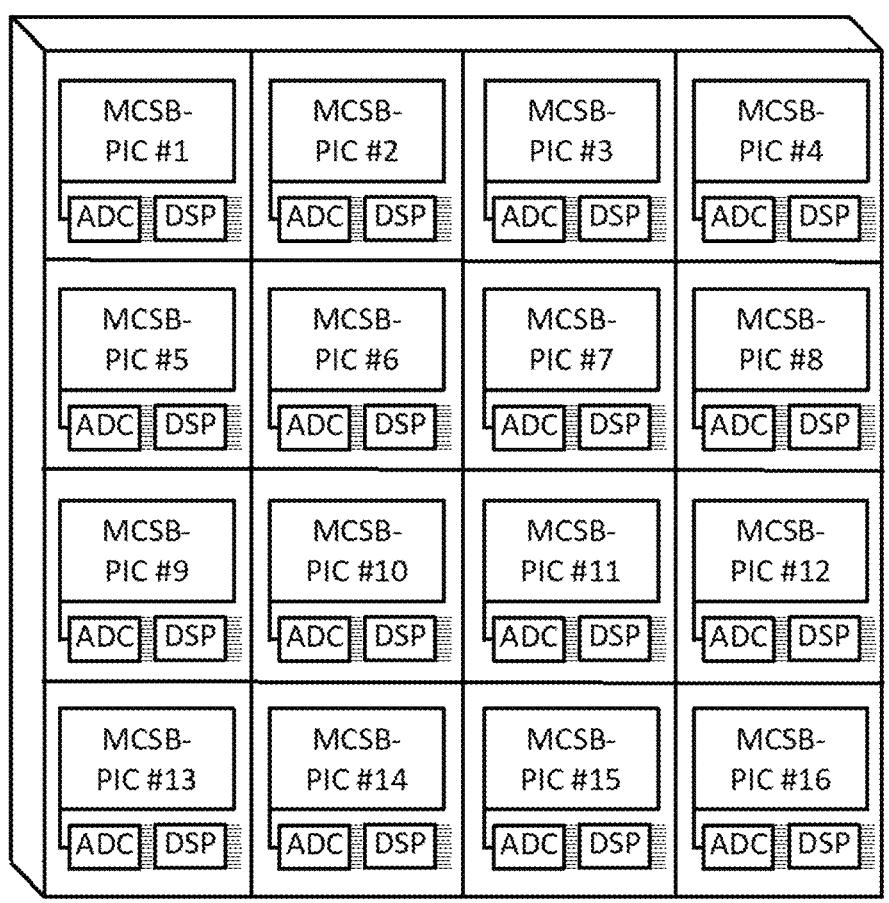
FIG. 5. Modular Hybrid Optical/Digital (MHOD) system schematic; optical beamforming on a single MCSB-PIC (e.g. supporting 8×8 antenna elements), with an analog to digital converter (ADC) and digital signal processing (DSP) per MCSB-PIC beamforming channel, followed by digital beamforming to combine information for all the elements of the array (additional digital beamforming elements not shown).

The MHOD system design is shown schematically in FIG. 5. Instead of two-stage optical multiplexing, in which optical signals must leave each MCSB-PIC to go to the GAPC device, within the MHOD design all optical signals stay on the MCSB-PIC, with only electrical input and output signals. In this case, the MCSB-PIC can include a wavelength division multiplexer to combine all the optical signals (which are at different WDM wavelengths), followed by a photodetector, or a differential (also known as balanced) pair of photodetectors; or the MCSB-PIC can include a GAPC device to combine the many optical signals without concern for their wavelengths, i.e. the channels do not have to be at specific wavelengths. The GAPC device can again be formed of a single array, or a differential pair array.

Figure 6:
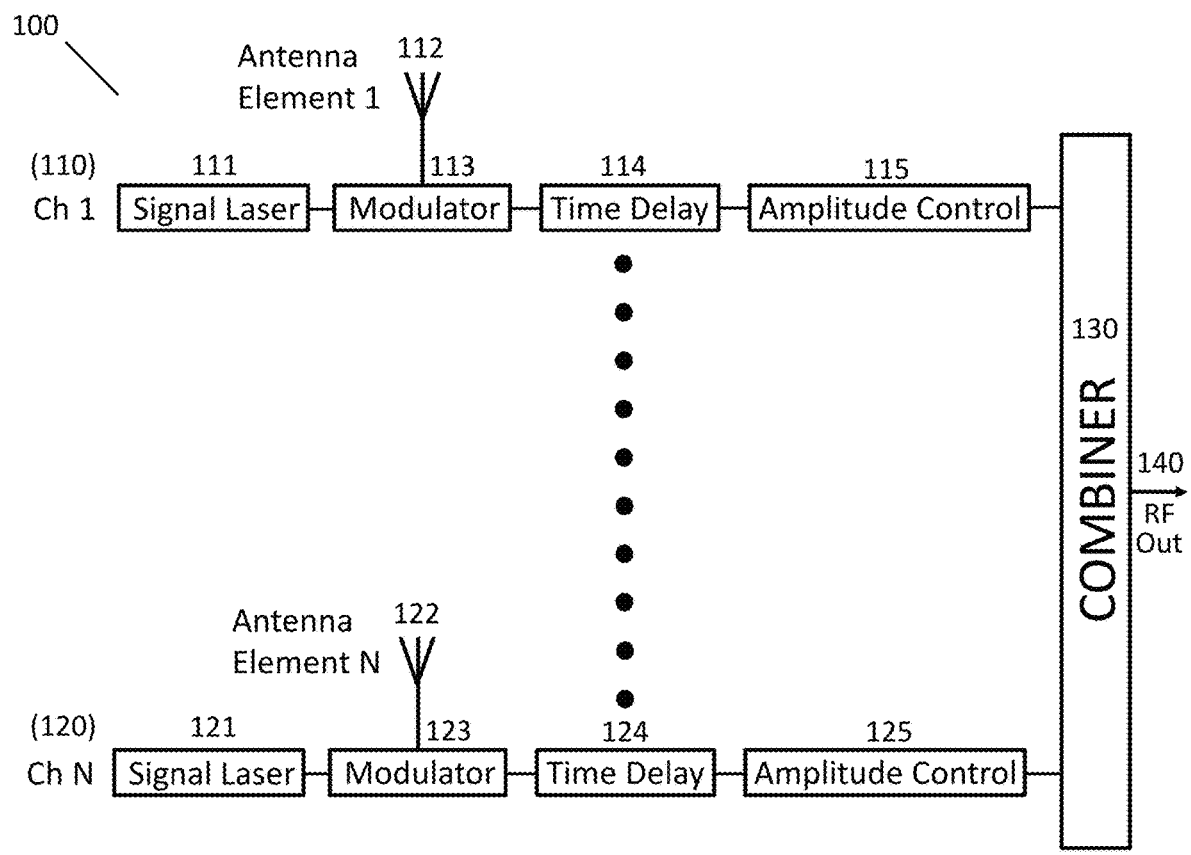
FIG. 6. Basic Rx-PAA system design schematic. One laser and signal channel per antenna element; the laser carrier is modulated by the electrical signal from the antenna element; this signal is time delayed and amplitude controlled; the optical signals from all antenna elements are combined to provide the beamformed output.

FIG. 6 shows an embodiment of the basic Rx-PAA system design 100. The system is made up of N channels, each channel supporting an antenna element. Channel 1, 110, includes a signal laser 111, an antenna element 112 which drives a modulator 113 and modulates the carrier from the laser 111. The modulated optical carrier passes through a tunable time delay device 114, which imparts a chosen time delay on the modulated signal, followed by an amplitude control device, or attenuator 115, which controls the size of the signal. The $N^{th}$ channel, 120, includes signal laser 121, antenna element 122, modulator 123, tunable time delay 124, and amplitude control/attenuator 125. Optical signals from all N channels, providing delayed and attenuated signals associated with N antenna elements, are combined in combiner device 130, providing a single RF beam-formed output 140. The beamforming is chosen by the values of time delay and attenuation for each channel. FIG. 6 shows the basic Rx-PAA system design for a single beamforming channel. The beam-formed RF output of this and other Rx-PAA systems in this invention are typically electrically band-pass filtered, and then passed into an analog to digital converter (ADC), followed by a DSP that is used to process information for that beamforming channel. Digital processing can be utilized to further linearize the system performance, increasing SFDR, counteracting the nonlinearity of components in the systems by applying the inverse characteristic, e.g. the sinusoidal transfer characteristic of the MZI modulator used in most systems can be linearized by providing the inverse transfer characteristic of the modulator.

Figure 7:
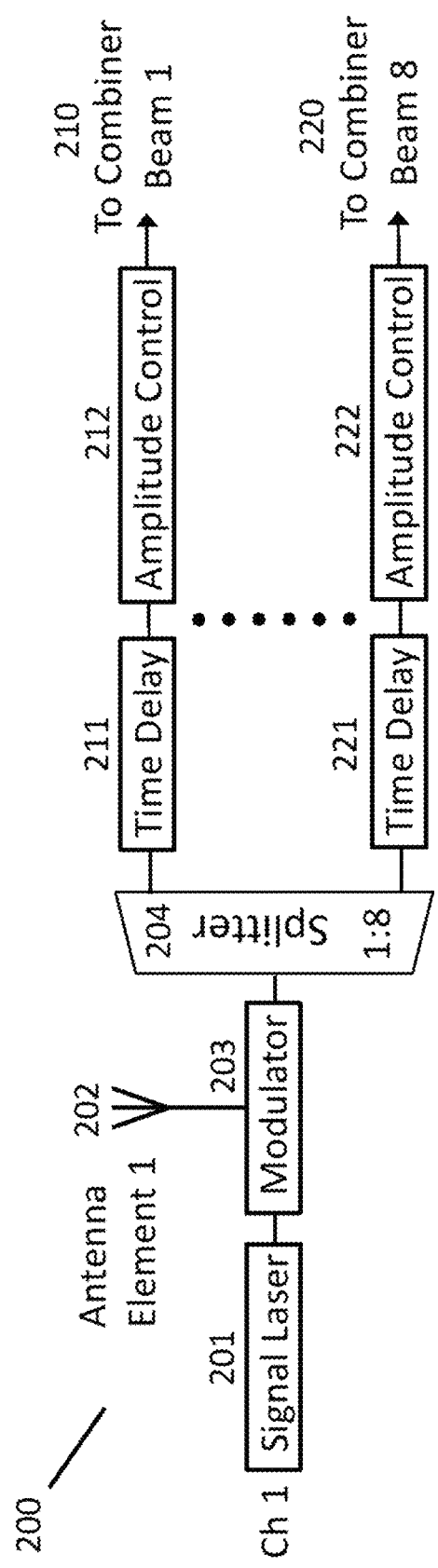
FIG. 7. Shows the use of an Optical Splitter in the Basic Rx-PAA system design to provide multiple simultaneous beamforming, a single optical channel is shown; the optical power splitter provides a set of X identical optical signals (8 shown), which can be independently processed (time delayed, amplitude controlled, and combined) to provide beamforming of X simultaneous and independent beams.

FIG. 7 shows how an optical power splitter can be used to create multiple simultaneous beams. FIG. 7 shows a single channel of the basic Rx-PAA system design shown in FIG. 6, expanded through the use of an optical power splitter, to create multiple output beams, in this example 8 beams. The power splitting scheme for channel 1, 200, includes a signal laser 201, antenna element 202, and modulator 203, which together provide a single modulated optical carrier based on the electrical signal from the antenna element. The modulated optical carrier is split into eight identical optical signals, each the same as the modulated optical carrier but smaller in size, by passing through an optical power splitter 204. Each of these identical optical signals passes through its own time delay device, attenuator, and then goes to the appropriate combiner for the specific output beam. The first of eight outputs from the splitter passes through time delay 211, amplitude control/attenuator 212 and on to the combiner for beam 1, 210. The last of eight outputs from the splitter passes through time delay 221, amplitude control/attenuator 222 and on to the combiner for beam 8, 220. Following the optical power splitter, all elements for each specific beam are the same as would be required for a single beam. The use of the silicon photonics integration platform, using CMOS foundry processing, enables the large scale integration required for this multiple simultaneous beamforming system.

Figure 8:
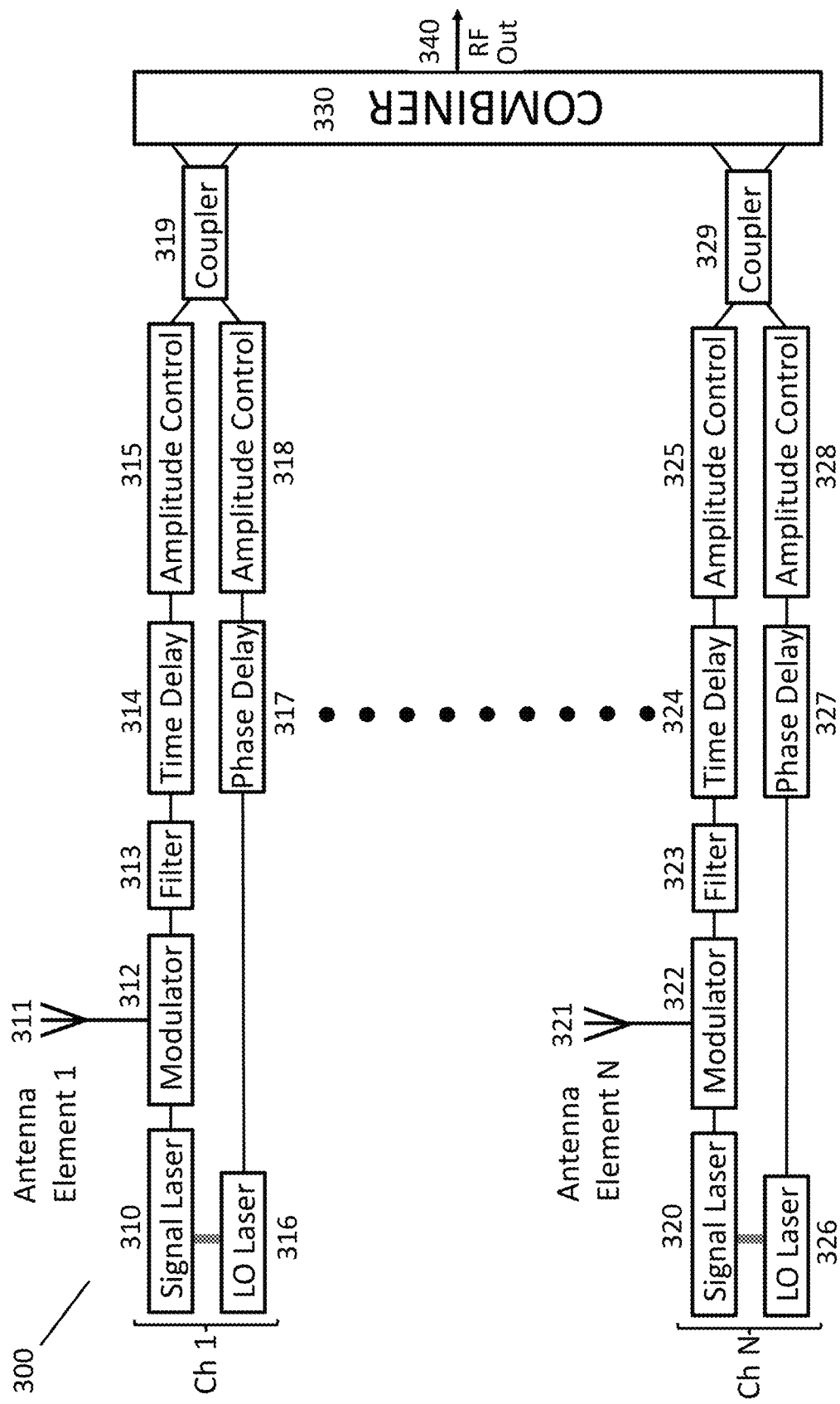
FIG. 8. Rx-PAA system including optical down-conversion to provide the output signal near baseband to utilize high performance ADCs; this design uses 2 locked lasers per channel, one for the antenna optical signal and one for the optical Local Oscillator (LO) to be used for down-conversion.

FIG. 8 shows an extension of the basic Rx-PAA system design 100 to include optical down-conversion within the system. The Down-converting Rx-PAA system 300, includes N channels, supporting N antenna elements, with the outputs from all N channels combined to provide the single beamforming RF output 340. FIG. 8 shows the down-converting Rx-PAA system for a single beamforming channel. The signal laser 310, for channel 1, has the electrical signal from antenna element 311 modulated onto the laser carrier by modulator 312. The frequency band that is required to be down-converted, is selected from the modulated signal using filter device 313; this chosen frequency band signal is then time delayed in time delay device 314, attenuated in amplitude control device 315, and then passes into coupler 319. A separate LO laser is locked to the signal laser with a specific offset frequency; this can be accomplished by frequency locking both lasers to a single ultra-high Q reference filter, each laser locked to a different resonance, with the chosen offset frequency set by the chosen resonances. For channel 1, the offset frequency of the LO laser 316 is chosen to align with the frequency band selected by filter 313, to enable down-conversion. The LO laser output is phase delayed in phase delay device 317, amplitude controlled in attenuator device 318, and then passes into coupler 319. The coupler 319, combines the channel 1 antenna signal and channel 1 LO signal, which replaces the optical carrier of the signal laser (which was removed by filter 313) with the LO signal, effectively creating a down-converted optical signal. The coupler 319, provides two outputs which are out of phase with one another; these are used with differential detection to cancel the relative intensity noise (RIN) effects of the laser and even order distortion products. Each of the N channels support a different antenna element, with the same series of optical elements. The $N^{th}$ channel has a signal laser 320 and LO laser 326, frequency locked with the same offset frequency as channel 1, and all the channels within 300. Antenna element 321 provides the electrical signal for modulator 322, modulating the carrier of the signal laser 320. Filter 323 selects the same frequency band from the modulated signal as filter 313 selected in channel 1. This chosen frequency band signal is then time delayed in time delay device 324, attenuated in amplitude control device 325, and then passes into coupler 329. The LO laser 326 output is phase delayed in phase delay device 327, amplitude controlled in attenuator device 328, and then passes into coupler 329. The coupler 329, combines the channel N antenna signal and channel N LO signal, which replaces the optical carrier of the signal laser (which was removed by filter 323) with the LO signal, effectively creating a down-converted optical signal. The outputs from all N couplers, for all N channels, are combined in the combiner 330, providing a single RF beamforming output 340. The combiner 330 includes a differential pair of combiners, one for each of the two outputs of each coupler.

Figure 9:
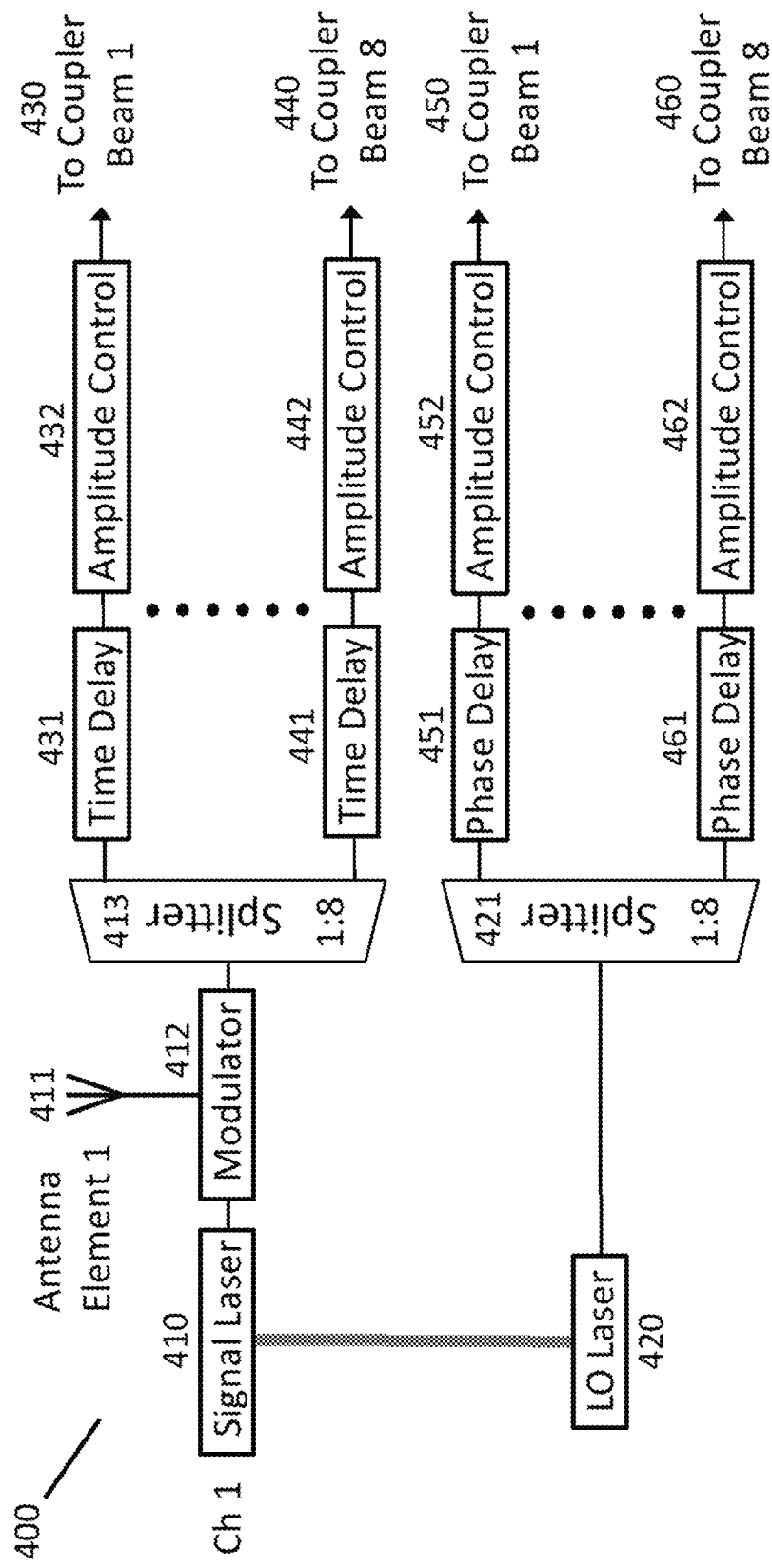
FIG. 9. Shows the use of an Optical Splitter in the Rx-PAA system including optical down-conversion using 2 locked lasers, to provide multiple simultaneous beams (8 shown); a single optical channel is shown.

FIG. 9 shows how optical power splitters can be used to create multiple simultaneous beams for the Down-converting Rx-PAA system shown in FIG. 8. Similar to the power splitting used in the Standard Rx-PAA system (FIG. 7), optical power splitters are used to create identical copies (8 copies in FIG. 9) of both antenna optical signals and LO signals, with these signals then passing through the same parallel set of photonic components to create individual, simultaneous down-converted RF beams. FIG. 9 shows optical power splitting and simultaneous beamforming (8 simultaneous beams) for channel 1 only, supporting a single antenna element; in the full system this is replicated for all N antenna channels. The carrier of the signal laser 410 is modulated by the electrical signal from antenna element 411, using modulator 412, and this modulated optical signal is split into 8 identical modulated optical signals, each the same as the modulated optical carrier but smaller in size, by passing through an optical power splitter 413. Each of these identical optical signals passes through its own time delay device, attenuator, and then goes to the appropriate coupler for the specific output beam. The first of eight outputs from the splitter 413 passes through time delay 431, amplitude control/attenuator 432 and on to the coupler for beam 1, 430. The last of eight outputs from the splitter passes through time delay 441, amplitude control/attenuator 442 and on to the coupler for beam 8, 440. Similarly, the output of the offset frequency locked LO laser 420 is split into 8 identical optical signals, each the same as the LO optical carrier but smaller in size, by passing through an optical power splitter 421. Each of these identical optical signals passes through its own phase delay device, attenuator, and then goes to the appropriate coupler for the specific output beam. The first of eight outputs from the splitter 421 passes through phase delay 451, amplitude control/attenuator 452 and on to the coupler for beam 1, 450. The last of eight outputs from the splitter passes through phase delay 461, amplitude control/attenuator 462 and on to the coupler for beam 8, 460. For the complete system, the couplers from all N channels, for a specific beam (e.g. beam 1), all go into a combiner to provide RF beam output 1. Similarly, combiners for each of the 8 beams provide 8 RF outputs.

FIG. 10 shows an alternative design for the Down-converting Rx-PAA system 500, which replaces the two separate locked lasers in FIG. 8 with a single laser that is split to provide the two optical carriers that form the antenna modulated signal and the LO optical signal. Channel 1 includes a single laser 510, the output of which is split in two, with the splitting ratio optimized for best system performance. Part of the laser carrier is modulated by modulator 512, driven by the electrical signal from antenna element 511. The frequency band that is required to be down-converted, is selected from the modulated signal using filter device 513; this chosen frequency band signal is then time delayed in time delay device 514, attenuated in amplitude control device 515, and then passes into coupler 521. The other part of the laser carrier is modulated in modulator 517, using the LO RF signal 516, and then this signal is filtered to select the required LO optical signal by filter 518. The filtered LO optical signal is then phase delayed in phase delay device 519, attenuated in amplitude control device 520, and then passes into coupler 521. Similarly for channel N, the output of laser 530 is split in two, with the splitting ratio optimized for best system performance. Part of the laser carrier is modulated by modulator 532, driven by the electrical signal from antenna element 531. The frequency band that is required to be down-converted, is selected from the modulated signal using filter device 533; this chosen frequency band signal is then time delayed in time delay device 534, attenuated in amplitude control device 535, and then passes into coupler 541. The other part of the laser carrier is modulated in modulator 537, using the LO RF signal 536, and then this signal is filtered to select the required LO optical signal by filter 538. The filtered LO optical signal is then phase delayed in phase delay device 539, attenuated in amplitude control device 540, and then passes into coupler 541. Coupler outputs from all N channels are combined within the combiner 550, providing a single RF beamforming RF output 560. FIG. 10 shows the schematic for a single beamforming channel, as in FIG. 8. This can be extended to create multiple beamforming using optical splitters, similar to that shown in FIG. 9.

FIG. 11 shows a similar Down-converting Rx-PAA system design to that in FIG. 10, however, in this case, the N channels utilize N lasers with different and separate wavelengths, and use a wavelength multiplexer in the combiner element, i.e. taking advantage of WDM. Channel 1 includes a single wavelength specific laser (WDM laser) 610, the output of which is split in two, with the splitting ratio optimized for best system performance. Part of the laser carrier is modulated by modulator 612, driven by the electrical signal from antenna element 611. The frequency band that is required to be down-converted, is selected from the modulated signal using filter device 613; this chosen frequency band signal is then time delayed in time delay device 614, attenuated in amplitude control device 615, and then passes into coupler 621. The other part of the laser carrier is modulated in modulator 617, using the LO RF signal 616, and then this signal is filtered to select the required LO optical signal by filter 618. The filtered LO optical signal is then phase delayed in phase delay device 619, attenuated in amplitude control device 620, and then passes into coupler 621. Similarly for channel N, the output of laser 630 is split in two, with the splitting ratio optimized for best system performance. Part of the laser carrier is modulated by modulator 632, driven by the electrical signal from antenna element 631. The frequency band that is required to be down-converted, is selected from the modulated signal using filter device 633; this chosen frequency band signal is then time delayed in time delay device 634, attenuated in amplitude control device 635, and then passes into coupler 641. The other part of the laser carrier is modulated in modulator 637, using the LO RF signal 636, and then this signal is filtered to select the required LO optical signal by filter 638. The filtered LO optical signal is then phase delayed in phase delay device 639, attenuated in amplitude control device 640, and then passes into coupler 641. Coupler outputs from all N channels are combined within the combiner 650, providing a single RF beamforming RF output 660. FIG. 11 shows the schematic for a single beamforming channel, as in FIG. 8. This can be extended to create multiple beamforming RF outputs using optical power splitters, similar to that shown in FIG. 9.

FIG. 12 shows a similar Down-converting Rx-PAA system design to that in FIG. 10, however, in this case, the combiner element is a GAPC device. Channel 1 includes a single non-wavelength specific laser (i.e. specific wavelength is not important, and could be the same, similar, or different for the different channels) 710, the output of which is split in two, with the splitting ratio optimized for best system performance. Part of the laser carrier is modulated by modulator 712, driven by the electrical signal from antenna element 711. The frequency band that is required to be down-converted, is selected from the modulated signal using filter device 713; this chosen frequency band signal is then time delayed in time delay device 714, attenuated in amplitude control device 715, and then passes into coupler 721. The other part of the laser carrier is modulated in modulator 717, using the LO RF signal 716, and then this signal is filtered to select the required LO optical signal by filter 718. The filtered LO optical signal is then phase delayed in phase delay device 719, attenuated in amplitude control device 720, and then passes into coupler 721. Similarly for channel N, the output of the non-wavelength specific laser 730 is split in two, with the splitting ratio optimized for best system performance. Part of the laser carrier is modulated by modulator 732, driven by the electrical signal from antenna element 731. The frequency band that is required to be down-converted, is selected from the modulated signal using filter device 733; this chosen frequency band signal is then time delayed in time delay device 734, attenuated in amplitude control device 735, and then passes into coupler 741. The other part of the laser carrier is modulated in modulator 737, using the LO RF signal 736, and then this signal is filtered to select the required LO optical signal by filter 738. The filtered LO optical signal is then phase delayed in phase delay device 739, attenuated in amplitude control device 740, and then passes into coupler 741. Coupler outputs from all N channels are combined within the GAPC device 750, providing a single RF beamforming RF output 760. FIG. 12 shows the schematic for a single beamforming channel, as in FIG. 8. This can be extended to create multiple beamforming using optical power splitters, as shown in FIG. 9.

Examples of a simulated Down-converting Rx-PAA system performance, based on the 2 stage multiplexing scheme shown in FIGS. 3 and 4, are shown in FIGS. 13 and 14. Calculated SFDR and Noise Figure (NF) are shown versus the total number of lasers in a system (e.g. 64 for a single MCSB-PIC system with 1 laser per channel, and 128 for a single MCSB-PIC system with 2 lasers per channel; larger numbers for 2 stage multiplexing). The simulated system includes a 1:8 optical power splitter in antenna and LO signal arms to provide 8 independent, simultaneous beamforming RF outputs. Results in FIG. 13 show that high SFDR can be reached using a combination of low RIN lasers (or RIN cancellation; which is included through the use of differential photodetectors) and linearized modulators. Low NF is achieved with a larger number of lasers (high multiplexing gain), or the addition of semiconductor optical amplifiers (SOAs) after the antenna modulators to increase the signal power for low numbers of lasers, e.g. for a single MCSB-PIC device. Simulations were carried out without including a low noise amplifier (LNA) at each antenna element (these are a requirement in electronic PAA systems) to show that the system can meet requirements without using LNAs, providing a lower power dissipation system and the potential for ultra-wide bandwidth operation; which is otherwise limited by LNA bandwidth.

A novel extension of the standard travelling wave array photodetector approach is proposed as part of this invention. The Group Array Photodetector Combiner (GAPC) device includes a large number of photodetectors e.g. 64 photodetectors, to combine the RF photonic signals from 64 independent optical inputs, provided on 64 separate waveguides. Within an MCSB-PIC this device can combine the signals from all 64 of the PAA antenna elements. Within this novel approach, the 64 photodetectors are split up into 'Groups' of a smaller number of PDs, e.g. 4 or 8, then these groups are combined within a synthetic transmission line structure to retain the bandwidth of the photodetector groups, to combine all outputs into a single electrical output. The large number of photodetector elements is required to physically separate the absorption volume of each channel, to avoid any interference effects that may occur if channel wavelengths overlap. Schematics for two such GAPC devices are shown in FIGS. 15 and 16. FIG. 15 shows groups of 4 photodetectors, labeled Group 1 (G1) to G16. For individual photodetectors, which have high responsivity, e.g. ~100%, and high speed, e.g. 38 GHz into 50 Ohms, combining a group of 4 devices reduces the ~3 dB bandwidth, to somewhat more than ¼ of 38 GHz because only 1 bond pad (capacitance) is used for 4 photodetectors. Similarly, for a Group of 8 photodetectors, the −3 dB bandwidth is still well beyond that required for the Down-converting Rx-PAA. For the Standard Rx-PAA system not including down-conversion, higher bandwidth GAPC devices are required, which will utilize smaller groups of devices as well as higher intrinsic bandwidth photodetectors.

The Groups are connected in the GAPC device with the correct inductance chosen to match the capacitance of the photodetector groups to create a synthetic 50 Ohm transmission line, i.e. $Z=\sqrt{L/C}$. With 50 Ohm matching terminations at both ends of the device, the overall matching resistance is 25Ω, increasing the −3 dB bandwidth of the array. For a practical 8×8 GAPC device, using an estimated capacitance from the photodetector active area of 30 fF and that of the single bond pad of 40 fF, the overall Group capacitance is 280 fF (values predicted for the photodetectors in a planned fabrication run). While the capacitance is increased by combining the photodetectors, reducing bandwidth, the series resistance, e.g. 20 Ohms—a typical value for a high speed photodetector, which typically limits the performance and number of elements in a traveling wave photodetector due to RF power loss, is significantly reduced (20/8=2.5Ω) by the parallel photodetectors. This group concept therefore significantly improves the traveling wave approach through the reduced resistance (signal loss), and is useful as long as the overall device bandwidth is sufficient for the application. Using these values for 8 Groups of 8 photodetectors, the bandwidth of the 64 GAPC device into 25Ω) is found to be still high, i.e. 20.7 GHz. Additionally, the cutoff frequency for the transmission line is calculated to be 22.7 GHz, using an inductance value, L, of 0.7 nH in this case. This 8×8 GAPC design clearly has significantly more bandwidth than the ~3 GHz flat bandwidth required for a Down-converting Rx-PAA system, and sufficient for a Standard Rx-PAA system operating up to 20 GHz.

Using this novel approach, a very large signal count, low loss, RF photonic combiner can be fabricated, which can combine the 64 signals on the MCSB-PIC, or more in future designs. One advantage of the GAPC is that each photodetector has only one input optical signal, and so the wavelength of the 64 signals does not have to be controlled. Having multiple optical signals as input to one photodetector requires different wavelength signals to avoid coherent effects when the signals are added; leading to the WDM approach option of the MCSB-PIC. Using the 64 channel combiner therefore avoids the need for WDM lasers and a WDM multiplexer in the single stage multiplexing version of the Rx-PAA, e.g. the MHOD system version. The spread of the optical power over many elements (64) also improves the thermal performance of these devices, which is the ultimate limitation in many high power, high speed photodetector applications.

The combiner or GAPC device used in Rx-PAA systems with two coupler outputs, i.e. + and − outputs, will utilize differential photodetector pairs for cancellation of RIN and even order distortion products; in that case, the GAPC designs shown in FIGS. 15 and 16 will be doubled up, to provide one such device for the + coupler outputs and one for the − coupler outputs, the 2 GAPC devices being wired as a differential pair.

Considering the GAPC device 800 shown in FIG. 15, this device is made up of 16 groups of 4 photodetectors. The first group, G1, 810, which has capacitance C, is made up of 4 high speed photodetectors, 815, 816, 817, and 818, with 4 input optical waveguides 811, 812, 813 and 814 respectively. The 4 high speed photodetectors are electrically directly connected to each other, so that their photo-detected currents are combined, and they share one bonding pad shown under the label G1. They therefore act like a single larger photodetector, but with 4 separate (independent) inputs. The device includes 16 groups, from G1 to G16. The last group, G16, is made up of 4 high speed photodetectors, 845, 846, 847, and 848, with 4 input optical waveguides 841, 842, 843 and 844 respectively. The synthetic transmission line is made up of the 16 Groups with capacitance C (and series resistance), matched with 15 inductors L between the groups, 861 between G1 and G2, and 862 between G15 and G16. At the ends of the synthetic transmission line are two load resistors, $R_L$ of typically 50 Ohms, 851 and 852, these load resistors separated from the end Groups by inductors of value L/2, i.e. 863 between $R_L$ and G1, and 864 between $R_L$ and G16. Optical inputs on all (64) waveguide inputs are converted to electrical signals and combined into a single RF output signal, which can be obtained across either load resistor $R_L$.

FIG. 16 shows GAPC device 900, which is made up of 8 groups of 8 photodetectors. The first group, G1, 920, which has capacitance C, is made up of 8 high speed photodetectors, 921, 922, 923, 924, 925, 926, 927 and 928, with 8 input optical waveguides 911, 912, 913, 914, 915, 916, 917 and 918 respectively. The 8 high speed photodetectors are electrically directly connected to each other, so that their photo-detected currents are combined, and they share one bonding pad shown under the label G1. They therefore act like a single larger photodetector, but with 8 separate (independent) inputs. The device includes 8 groups, from G1 to G8. The last group, G8, is made up of 8 high speed photodetectors, 961, 962, 963, 964, 965, 966, 967 and 968, with 8 input optical waveguides 951, 952, 953, 954, 955, 956, 957 and 958 respectively. The synthetic transmission line is made up of the 8 Groups with capacitance C (and series resistance), matched with 7 inductors L between the groups, 981 between G1 and G2, and 982 between G7 and G8. At the ends of the synthetic transmission line are two load resistors, $R_L$ of typically 50 Ohms, 971 and 972, these load resistors separated from the end Groups by inductors of value L/2, i.e. 983 between $R_L$ and G1, and 984 between $R_L$ and G8. Optical inputs on all (64) waveguide inputs are converted to electrical signals and combined into a single RF output signal, which can be obtained across either load resistor $R_L$.

This invention provides ultra-wideband, multiple simultaneous beamforming over a wide frequency range, or alternatively it can provide tunable optical down-conversion of a frequency band within the Rx-PAA architecture to convert different RF frequency bands near baseband. This tunable Down-conversion Rx-PAA is equivalent to a tunable, single frequency band RF channelizer, as a frequency band can be chosen and produced at the beamforming RF output. The choice of beamforming parameters can provide a single tunable frequency band RF channelizer with any beam-shape, from a broad beam to look in all directions together, to a narrow aimed channelizer beam-shape. The single tunable frequency band RF channelizer can be expanded to create a multiple tunable frequency band RF channelizer, as shown in FIG. 17, or in the limit when all channels are included, this provides a full RF channelizer. An advantage of using tunable channelizer frequency bands is that fewer ADC and following electronics are necessary when all channels are not populated; reducing overall component size, power and cost. FIG. 17 shows a multiple frequency band RF channelizer schematic, in this case using multiple locked LO lasers to provide the optical LO's for each frequency band (and eliminating the need for many tunable RF LO signals)—extending the locking approach described in FIG. 8. Alternatively, the multiple LOs could be generated from a single laser split into multiple outputs and modulated with an RF LO signal, which for a larger number of LOs could include optical amplification (e.g. with an SOA) to increase the power level of each LO.

Within FIG. 17, channel 1 of a multiple frequency band RF channelizer is shown; 1000. The channel 1 antenna laser 1010 is modulated by the modulator 1030, using the electrical signal from antenna element 1020. The modulated carrier signal passes through a series of tunable filters, the first filter 1040 and the last filter, Filter Y 1050. Each in the series of tunable filters selects a frequency band for down-conversion, and passes the remaining modulated signal along to the next filter in line. Filter 1, 1040, selects a frequency band which passes through time delay device 1060, amplitude control device 1070, and into coupler 1, 1130. The output from LO laser 1, 1100, passes through phase control device 1110, through amplitude control device 1120, and into coupler 1, 1130. Coupler 1 provides + and − outputs for the channel 1 input to a combiner for frequency band 1. This combiner has inputs from + and − coupler outputs of all N channels, and provides a frequency band 1 beam-formed RF output. Each filter and LO pair are combined in a coupler to provide + and − outputs to the combiner for the associated frequency band. In FIG. 17, the last filter, Filter Y 1050, selects a frequency band which passes through time delay device 1080, amplitude control device 1090, and into coupler 1, 1330. The output from LO laser Y, 1300, passes through phase control device 1310, through amplitude control device 1320, and into coupler 1, 1330. Coupler Y provides + and − outputs for the channel Y input to a combiner for frequency band Y. This combiner has inputs from + and − coupler outputs of all N channels, and provides a frequency band Y beam-formed RF output.

FIG. 18 shows a prior art example of a PAA, utilizing bowtie antenna elements that can provide a wide transmit bandwidth for each antenna element. FIG. 19(*a*) shows a sub-array of the full antenna, in this case showing 16 bowtie antenna elements in a 4×4 grid, also showing the typical antenna element spacing of $\lambda/2$, where $\lambda$ is the electrical wavelength at the highest operating RF frequency of the antenna. FIG. 19(*b*) shows a prior art example of an optically driven Tx-PAA, in which photodetectors (typically high-power, high-speed photodetectors) are connected electrically to the antenna elements on one side, while optical fibers to each photodetector provide their optical input. In the present invention, all of the optical processing and all of the optical signals are kept within one or more MCSB-PIC devices, which are tiled across the back of the antenna array. Electrical outputs from the MCSB-PIC devices drive the antenna elements, either directly, through a matching circuit, e.g., to match the impedance of the antenna to the photodetector to provide maximum power transfer, or through an optional PA. Some applications may prefer the actual antenna array to be remote or separate from the MCSB-PIC, in which case it is possible to move the photodetectors from the MCSB-PIC to the antenna array, and interconnect the MCSB-PIC to the photodetectors using optical fibers. This may be possible for even the optical up-converter architectures, as the parts of the optical circuit that require optical phase control would still be kept within the PIC circuit, i.e., on a solid substrate with excellent optical phase control.

FIG. 20 shows an embodiment of an exemplary basic Tx-PAA system design 2000. The system comprises N channels, each channel of the N channels supporting a transmit antenna element. A plurality of transmit antenna elements comprise a given transmit phased array antenna according to the present invention. The transmit phases array antenna further comprises one or more photonic integrated circuits (i.e. J PICs, where J≥1, each of the one or more PICs comprising a common substrate, the common substrate including one or more complete optical channels (i.e. K complete optical channels, where K≥1), said one or more optical channels also supporting a corresponding transmit antenna element of the transmit phased array antenna. In all cases, J×K≥N.

In the example of FIG. 20, N=1024. Channel 1 2010 includes a signal laser 2011, an electrical RF signal 2012 which drives a modulator 2013 and modulates the optical carrier from the laser 2011. The modulated optical carrier, i.e. the optical RF signal, passes through a tunable time delay device 2014, which imparts a chosen time delay on the optical RF signal, followed by an amplitude control device, or attenuator 2015, which controls the size of the signal by adjusting its amplitude. This signal is then input to photodetector 2016, which converts the optical RF signal to an electrical signal, the electrical signal driving the Channel 1 antenna element 2018, either directly or through an optional intermediate electronic power amplifier (PA) 2017. A digital signal processor (DSP) may be used to provide a collective output from the time delays and the amplitude controls via the transmit phased array antenna. The $N^{th}$ channel, 2020, includes signal laser 2021, RF signal 2022, modulator 2023, tunable time delay 2024, amplitude control/attenuator 2025, photodetector 2026, optional PA 2027, and antenna element 2028. The RF signals provided to each antenna element in this design are the same. The RF beamforming processing is carried out by applying different time delays and different amplitudes to the optical signals, via the tunable time delay 2024 and attenuator 2025, respectively, driving each antenna element in the antenna array. These variable time delays and amplitudes are calculated in a central processing unit (e.g., a digital signal processing (DSP) device) in order to provide the required RF beamforming. Electrical signals controlled by the DSP are applied to the photonic devices to create the required time delays and amplitudes.

All optical signals within an optical channel are kept within a single PIC, which provides a solid substrate of, e.g., silicon, indium phosphide, or gallium arsenide. The single PIC provides optical phase control of all of the signals within the PIC that travel between individual integrated components in optical waveguides. All of the inputs and outputs to the MCSB-PIC in this case are electrical, including the RF signal inputs to the modulators, the RF signal outputs from the photodetectors, and all of the bias voltages and currents for the individual integrated devices (e.g., the lasers, modulators, tunable time delay device, amplitude control/attenuator device, photodetectors, as well as any associated optical monitoring devices that may be included on the MCSB-PIC in order to control and operate the device, e.g., tap waveguides and monitor photodiodes to monitor the optical power levels). A digital signal processor (DSP, DSP device), or another processing element such as a microcontroller or FPGA, within the MCSB-PIC module controls all of the individual components on the PIC and monitors its operation. Optical signals from all of the N channels provide time delayed and attenuated signals to the N antenna elements, so that, in the far field of the PAA, a single RF beamformed output is produced. The beamforming is chosen by the values of time delay and attenuation for each channel, with the DSP providing control of the time delay devices and attenuation devices. FIG. 20 thus illustrates this basic Tx-PAA system design for a single RF beamforming system.

FIG. 21 shows an embodiment of the present invention in which an array photodetector combiner is used together with multiple optical channels to create multiple simultaneous RF beams. FIG. 21 shows the multiple-channel design supporting a single antenna element of the basic Tx-PAA system design shown in FIG. 20, expanded through the use of multiple (M) optical channels/signals per each antenna (N) channel and an array photodetector combiner, which combines the optical signals for multiple RF beams into a single electrical output that then drives the single antenna element. The use of an array photodetector, or, if required, a GAPC device, ensures that each optical signal from each optical channel goes to a single photodetector. It also ensures that no photodetector detects two optical signals which may be overlapped in optical spectrum, which causes interference and noise, and which would significantly reduce the performance of the system, via increased NF and reduced SFDR. The array photodetector or GAPC device sums the currents from each of the individual photodetectors, providing an electrical output that includes all of the input optical signals. For the complete PAA, all antenna elements include signals from each of the required RF beams, the result being the formation of multiple RF beams in the far field RF signal transmitted from the antenna array.

FIG. 21 illustrates how, in one embodiment of the invention, M optical channels are used to support M (i.e. the same number of) RF beams for a single antenna element 3000. Channel 1 3010 is comprised of a signal laser 3011, which provides the optical carrier to a modulator 3013, modulated with RF signal 1 3012 for RF beam 1. The optical RF signal passes through a tunable time delay element 3014 used to control the time delay of the signal, and an amplitude control/attenuator 3015, which controls the amplitude of the optical signal before that optical signal is input to the array photodetector combiner 3016. Similarly, Channel M 3020 comprises a signal laser 3021, RF signal M 3022, modulator 3023, tunable time delay 3024, and amplitude control 3025, the output of which becomes the input to one of the photodetector elements of the array photodetector combiner 3016. For an M RF beamforming system there are M (i.e. the same number of) individual photodetectors within the photodetector array. The array photodetector combiner, or GAPC device, sums the photocurrents of each of the photodetectors with the correct RF delay at its output, i.e., the same added RF delay (or optical time delay) for each of the optical inputs to the device, providing a single electrical output to drive the antenna element 3018, with an optional PA 3017. The array photodetector may be a group of individual photodetectors with a common bond pad/output, which combines the currents from each photodetector into a single output. This is equivalent to a single group of a GAPC device. Increasing the number of individual photodetectors in the array reduces its bandwidth, which may become too small for system operation, e.g. when increased up to 16 photodetectors; in these cases, it is preferable to use a GAPC device comprising multiple Groups of photodetectors, e.g. 4 Groups of 4 photodetectors, where the GAPC bandwidth is similar to that of the Group of 4 photodetectors, i.e. sufficient bandwidth for system operation.

FIG. 22 shows an alternative system to create multiple simultaneous RF beams 4000, using wavelength division multiplexing (WDM) rather than photodetector array multiplexing as shown in FIG. 21. In this embodiment, the M optical channels for the M simultaneous RF beams each have their own WDM wavelength ($\lambda_1$ to $\lambda_M$), which are combined together with low optical loss in the WDM combiner/multiplexer 4026. Channel 1 4010 comprises a WDM signal laser 1 4011, operating at wavelength 1, i.e. $\lambda_1$, an optical modulator 4013 modulated by RF signal 1 4012, providing an optical RF signal that passes through the tunable time delay device 4014 followed by an amplitude control device 4015, before entering the WDM combiner 4026. Similarly, channel M 4020 comprises a WDM signal laser, $\lambda_M$, RF signal M 4022, modulator 4023, tunable time delay 4024, and amplitude control/attenuator 4025, the attenuator's optical RF signal output feeding into WDM combiner 4026. The WDM combiner 4026 combines each of the WDM optical signals into a single optical output which passes into photodetector 4016. The use of WDM means that each optical signal is separated by a fixed wavelength/frequency, said fixed wavelength/frequency being determined such that there is no possibility that optical signals from one optical channel overlap and interfere with an optical signal from an adjacent optical channel. This requirement allows for low loss optical combining of each of the optical signals for the M RF beams, without additional noise which would occur if the optical signals overlapped. The photodetector output current includes signals from all of the different wavelength channels, which provides an electrical drive for the antenna element 4018, with an optional PA 4017 between the photodetector output and the antenna element.

FIGS. 21 and 22 demonstrate embodiments of the present invention utilizing multiple optical channels that are combined in either an array photodetector combiner (or GAPC device) or using WDM and a WDM combiner, in order to combine the signals from each of these channels into a single electrical output to drive a single antenna element. In one embodiment, this approach is used to provide multiple simultaneous RF beams for the TX-PAA system. In another embodiment, where only a single RF Beam is required, it is possible to increase the RF power for that single channel provided to the antenna element from the photodetector or photodetector array by creating identical signals in each of the multiple optical channels so that when they are combined they provide the same signal shape but with a larger size, i.e., a larger RF power provided to the antenna element, and a larger overall Tx-PAA transmitted power (i.e. optical gain). In a further embodiment, it is possible to both have multiple simultaneous RF beams and higher power per RF beam (optical gain), by using many channels, e.g., L channels for each RF beam, for each of M RF beams, utilizing a total number of (L*M) optical channels. A large number of optical channels per antenna element, providing multiple RF beams, each with high RF power to the antenna element, and with high frequency operation, will best utilize the unique capabilities of a GAPC device.

FIG. 23 illustrates another embodiment of the present invention comprising an extension of the basic Tx-PAA system design 2000 to include optical up-conversion within the system. The exemplary up-converting Tx-PAA system 5000, includes N channels supporting N antenna elements, with the appropriate signal processing, i.e., time delay and amplitude control on a per element basis, in order to provide a single RF beamformed output from the Tx-PAA. For channel 1 5010, the signal laser 5011 has the electrical signal from RF signal 5012 modulated onto the laser carrier by a modulator 5013. The frequency band that is required to be up-converted is selected from the modulated signal using a tunable filter device 5014, e.g., the filter device removes an opposite sideband and the carrier, and provides a single sideband of the modulated signal. The tunable bandpass filter with chosen center frequency/wavelength, and bandpass bandwidth e.g. 2 GHz, is an integrated tunable filter controlled by electrical signals provided by a DSP, such as a micro-ring resonator based tunable filter. This chosen frequency band signal is then time delayed in a tunable time delay device 5015, and passes into a coupler 5019. A separate LO laser 5016 is locked to the signal laser with a specific offset frequency. This can be accomplished, e.g., by frequency-locking both lasers to a single ultra-high Q reference filter, each laser being locked to a different resonance, and with a chosen offset frequency set by the chosen resonances. For channel 1, the offset frequency of the LO laser 5016 is chosen to align with the frequency band selected by the filter 5014 to enable up-conversion to the required RF frequency band. The LO laser output is phase delayed in a phase delay device 5017, amplitude controlled in an attenuator device 5018, and then passed into the coupler 5019. The coupler 5019 combines the channel 1 optical RF signal and the channel 1 optical LO signal, which replaces the original optical carrier of the signal laser (which was removed by filter 5014) with the optical LO signal, effectively creating the up-converted optical signal, with very high fidelity. The coupler 5019 provides two outputs which are out of phase with one another (e.g. one phase is positive while the other phase is negative); these phases are used with differential detection in a balanced photodetector 5020 which cancels the RIN of the laser and even order distortion products. The output of the balanced photodetector 5020 is used to drive an antenna element 5022, optionally with a PA 5021 between the balanced photodetector and the antenna element. The balanced photodetector 5020 may optionally have a single output voltage, or a differential output, as required for optimum performance when integrating the photodetector output with the antenna element, or a PA and antenna element. Each of the N channels support a different antenna element with the same series of optical elements. Channel N, 5110, has a signal laser 5111 and an LO laser 5116 that is frequency-locked with the same offset frequency as channel 1, and all of the channels within the up-converting T-PAA system 5000. An RF signal 5112 provides the electrical signal for a modulator 5113, modulating the carrier of the signal laser 5111. A tunable filter 5114 selects the same frequency band as the filter 5014 selected in channel 1, also removing an opposite sideband and the carrier. This chosen frequency band signal is then time delayed in time device 5115, after which it passes into a coupler 5119. The output of the LO laser 5116 is phase delayed in phase delay device 5117, amplitude controlled in attenuator device 5118, after which it passes into a coupler 5119. The coupler 5119 combines the channel N optical signal and channel N LO signal, which replaces the original optical carrier of the signal laser (which was removed by filter 5114) with the optical LO signal, effectively creating an up-converted optical signal. The coupler 5119, provides two outputs which are out of phase with one another (positive and negative). These two outputs are used with differential detection in balanced photodetector 5120, to cancel the RIN of the laser and even order distortion products. The output of the balanced photodetector 5120 is used to drive antenna element 5122, optionally with a PA 5121 between the balanced photodetector and the antenna element. Up-converted optical signals from all N channels provide time delayed and attenuated electrical signals to the N antenna elements, so that in the far field of the PAA, a single RF beamformed output is produced at the up-converted RF frequency.

FIG. 24 shows an embodiment of the present invention in which a balanced array photodetector combiner is used together with multiple optical channels to create multiple simultaneous RF beams. FIG. 24 shows the multiple-channel design supporting a single antenna element of the up-converting Tx-PAA system design shown in FIG. 23, expanded through the use of multiple optical channels and a balanced array photodetector combiner which combines the optical signals for multiple RF beams into a single electrical output. The single electrical output then drives the single antenna element. The use of a balanced array photodetector, or, if required, a balanced-GAPC device, ensures that each optical signal from each optical channel feeds to a single photodetector, and that no photodetector detects two optical signals which may be overlapped in optical spectrum, thus removing interference and noise which would significantly reduce the performance of the system via increased NF and reduced SFDR. The balanced array photodetector, or balanced-GAPC device, sums the currents from each of the individual photodetectors, providing an electrical output that includes all of the input optical signals. The use of a balanced photodetector, a balanced array photodetector, or a balanced-GAPC device following the coupler that combines the optical RF signals and optical LO signals, provides for a higher RF signal power while cancelling/reducing the laser RIN and even order distortion products. For the complete Tx-PAA, all antenna elements include signals from each of the required RF beams, the result being the formation of multiple RF beams in the far field RF signal transmitted from the antenna array.

In FIG. 24, the multiple RF beam up-converting Tx-PAA system 6000 includes M optical channels to create M RF beams for the Tx-PAA. Channel 1 6010 comprises a signal laser 6011 which is modulated by modulator 6013 using RF signal 1 6012, the optical RF signal passing through filter 6014 that selects the frequency band for up-conversion. Time delay device 6015 provides the correct time delay, and this optical signal passes into coupler 6019. LO laser 6016 is frequency locked at an offset frequency to the signal laser, e.g., through locking to the same optical reference filter on different resonance frequencies, or by mixing parts of the two laser carriers in a detector and using the resulting RF tone to lock the frequency difference of the lasers to a chosen frequency. The output of LO laser 6016 has its optical phase controlled by phase delay device 6017, which may comprise, e.g., a thermal heater on a waveguide that controls the optical phase or path length through the device by changing the temperature and therefore the effective index of the waveguide. The phase controlled LO signal is amplitude controlled using variable attenuator 6018, and the resulting phase controlled and amplitude controlled optical LO signal enters the 50/50 directional coupler 6019. The coupler 6019 combines the optical RF signal and optical LO signal, providing two outputs that are 180 degrees out of phase with each other (+ and −), said two outputs feeding into a single balanced pair of photodetectors comprising part of the balanced array photodetector combiner 6020. Similarly, channel M 6110, which provides the signal to antenna element 6022 for RF beam M, comprises a signal laser 6111, RF signal M 6112, modulator 6113, filter 6114, and time delay 6115, providing an optical RF signal into coupler 6119. Additionally, LO laser 6116 passes through phase delay device 6117 and amplitude control device 6118 before passing into the same coupler 6119. The coupler 6119 combines channel M's optical RF signal and optical LO signal, providing two output signals into the balanced array photodetector combiner 6020. The output of the balanced array photodetector combiner 6020, which may be a single or a balanced RF signal, drives antenna element 6022, with the optional inclusion of PA 6021. Up-converted RF signals from each optical channel with their required time delay and amplitude control for each of the RF beams, are summed together in the balanced array photodetector combiner 6020, such that antenna element 6022 emits electromagnetic radiation that includes the signals from all of the M optical channels. The complete Tx-PAA, including all N antenna elements, each driven by all M RF channels and associated time delays and amplitude control (selected by electrical drives to these components from the control electronics of the module) emits M simultaneous RF beams that are controlled by the associated time delays and amplitude controls (attenuations).

FIG. 25 illustrates an embodiment of the current invention that utilizes a single laser split into two parts to create the optical RF signal and the optical LO signal for use in the up-conversion scheme. FIG. 25 shows a multiple RF beam version of the up-conversion Tx-PAA architecture 7000 that uses a balanced array photodetector combiner to combine the optical channels for M RF beams to provide a single electrical drive waveform for antenna element 7025. Channel 1 7010, which provides the optical signal for RF beam 1, comprises signal laser 7011, the output of which is split into two parts by an optical splitter 7012, which might comprise, e.g., a directional coupler device, the split ratio being chosen to optimize system performance. One part of the laser power from splitter 7012 feeds to modulator 7014 which is driven by RF signal 1 7013. The modulated output passes through filter 7015 which selects the frequency band for up-conversion (e.g. the filter selecting a frequency band in one sideband of the modulator output, removing the opposite sideband and carrier signal). The filtered signal passes through time delay device 7016, which applies the required time delay, before entering coupler 7022. The other part of the laser power from splitter 7012 feeds to modulator 7018 (which can be an MZI modulator or a phase modulator) which is driven by LO signal 1 7017, the output of which passes through filter 7019 which selects the required optical LO signal from one modulation sideband and removes all other optical signals. This optical LO signal passes through phase delay device 7020, which controls the optical phase of the optical LO signal, and then through amplitude control/attenuator device 7021, before entering coupler 7022. The 50/50 coupler 7022 combines the optical RF signal and optical LO signal and provides two outputs that are 180° out of phase with each other (+ and −), which are input to the balanced array photodetector combiner 7023. Similarly, RF beam M is generated by optical channel M 7110, which comprises signal laser 7111, splitter 7112, RF signal M 7113, and associated modulator 7114, followed by filter device 7115 and time delay device 7116 providing one input to coupler 7122, and additionally from the other output of splitter 7112, LO signal M 7117 and associated modulator 7118, followed by filter device 7119, phase delay/control device 7120, and amplitude control/attenuator device 7121 to provide the second input to coupler 7122. The output of coupler 7122, together with the outputs of all similar M couplers for the M RF beams, are input to the balanced array photodetector combiner 7023, which provides an electrical output to drive antenna element 7025, either directly or optionally through PA 7024, using either single ended or differential electrical signaling. The complete Tx-PAA system, including all N antenna elements, each driven by all M RF channels and associated time delays and amplitude control (selected by electrical drives to these components from the control electronics of the module) emits M simultaneous RF beams that are controlled by the associated time delays and amplitude control.

FIG. 26 illustrates an embodiment of the invention comprising multiple simultaneous RF beam generation including optical up-conversion 8000, similar to the architecture described in FIG. 24 which utilizes a balanced array photodetector combiner (or balanced-GAPC). In this case, however, WDM wavelength optical channels for each of the RF beam channels are employed, followed by a dual WDM combiner to combine all of the signals into a single pair of optical outputs. Said pair of optical outputs are then input to a balanced photodetector to provide the electrical signal to drive the antenna element. This embodiment utilizes two lasers to create the two required optical signals, i.e. the optical RF signal and the optical LO signal, which are utilized in the up-conversion scheme. For the complete Tx-PAA system, all antenna elements include signals from each of the required RF beams, the result being the formation of multiple RF beams in the far field transmitted RF signal from the antenna array.

In FIG. 26, the exemplary multiple RF beam up-converting Tx-PAA system 8000 includes M optical channels per antenna element to create M RF beams from the Tx-PAA. Channel 1 8010 comprises a WDM signal laser 8011 operating at $\lambda_1$, which is modulated by modulator 8013 using RF signal 1 8012, the modulated signal passing through filter 8014 that selects the frequency band for up-conversion. Time delay device 8015 provides the correct time delay, and this optical RF signal passes into coupler 8019. LO laser 8016 is frequency locked at an offset frequency to the signal laser, i.e. operating at $\lambda_1 +/- \delta f$ where $\delta f$ is the offset frequency, e.g., through locking to the same optical reference filter on different resonance frequencies, or by mixing parts of the two laser carriers in a detector, and using the resulting RF tone to lock the frequency difference of the lasers to a chosen RF frequency. The output of LO laser 8016 has its optical phase controlled by phase delay device 8017. The phase controlled LO signal is amplitude controlled using variable attenuator 8018, and the resulting phase controlled and amplitude controlled optical LO signal enters the coupler 8019. The coupler 8019 combines the WDM optical RF signal and WDM optical LO signal, providing two outputs that are 180 degrees out of phase with each other (+ and −), these outputs going to the dual WDM combiner 8020. Similarly channel M 8110, which provides the signal to antenna element 8023 for RF beam M, comprises a WDM signal laser 8111 operating at $\lambda_M$, RF signal M 8112, modulator 8113, filter 8114, and time delay 8115 providing an optical RF signal into coupler 8119. Additionally, LO laser 6116, operating at $\lambda_M +/- \delta f$, passes through phase delay device 8117 and amplitude control device 8118 before passing into coupler 8119. The coupler 8119 combines the channel M optical RF signal and optical LO signal, providing two outputs that are 180 degrees out of phase with each other (+ and −), these outputs feeding to the dual WDM combiner 8020. The dual WDM combiner 8020 comprises two identical WDM combiners, one WDM combiner taking the positive phase output from each of the M couplers (e.g. 8019 through 8119) and the second WDM combiner taking the other (negative phase) output from each of the M couplers. Each WDM combiner/multiplexer combines all of the M WDM signals into a single optical output, so that 2 outputs of the two (or dual) WDM combiners feed into a balanced photodetector 8021. The output of the balanced photodetector 8021, which can be a single or balanced RF electrical signal, drives antenna element 8023, with the optional inclusion of PA 8022. Up-converted RF signals from each optical channel with their required time delay and amplitude control, i.e. for each of the RF beams, are summed together in the balanced photodetector, so that antenna element 8023 emits electromagnetic radiation that includes the signals from all of the M optical channels. The complete Tx-PAA system, including all N antenna elements, each driven by M RF channels with associated time delays and amplitude control (selected by electrical drives to these components from the control electronics of the module) emits M simultaneous RF beams that are controlled by the associated time delays and amplitude controls.

FIG. 27 illustrates an embodiment of the present invention that utilizes a single WDM laser split into two parts to create the optical RF signal and the optical LO signal for use in the up-conversion scheme, showing a multiple RF beam version of the up-conversion Tx-PAA architecture 9000 that uses a WDM combiner to combine the optical channels for M RF beams, followed by a balanced photodetector to provide a single electrical drive waveform for antenna element 9026. FIG. 27 shows the optical architecture for a single antenna element. Channel 1 9010, which provides the optical signal for RF beam 1, comprises WDM signal laser 9011, operating at $\lambda_1$, the output of which is split into two parts by an optical splitter 9012, the split ratio being chosen to optimize system performance, which may be accomplished using a tunable splitter device, e.g., a tunable directional coupler splitter which can be designed using a tunable MZI structure. One part of the laser power from splitter 9012 feeds to modulator 9014 which is driven by RF signal 1 9013, the modulated output passing through filter 9015 which selects the frequency band for up-conversion. The filtered signal passes through time delay device 9016, which applies the required time delay, after which it enters coupler 9022. The other part of the WDM laser power from splitter 9012 feeds to modulator 9018, which is driven by LO signal 1 9017, the output of which passes through filter 9019, which selects the required LO signal from one modulation sideband and removes all other optical signals. This optical LO signal passes through phase delay device 9020, which controls the optical phase of the optical LO signal, and through amplitude control/attenuator device 9021, before entering coupler 9022. The coupler 9022 combines the optical RF signal and optical LO signal and provides two outputs that are 180° out of phase with each other (+ and −), which are input to the dual WDM combiner 9023. Similarly, RF beam M is generated by optical channel M 9110, which comprises WDM signal laser 9111, operating at $\lambda_M$, splitter 9112, RF signal M 9113, and associated modulator 9114, followed by filter device 9115 and time delay device 9116, thereafter providing an input to coupler 9122. Additionally, from the other output of splitter 9112, LO signal M 9117 and associated modulator 9118, followed by filter device 9119, phase delay/control device 9120, and amplitude control/attenuator device 9121, provide the second input to coupler 9122. The outputs of coupler 9122 (+ and −), together with the outputs of all similar M couplers for M RF beams, are input to the dual WDM combiner 9023. The dual WDM combiner 9023 comprises two identical WDM combiners, one taking the positive phase output from each of M couplers and the other taking the negative phase output from each of the M couplers. Each WDM combiner/multiplexer combines all of the M WDM signals into a single optical output, so that the two outputs of the WDM combiners go into a balanced photodetector 9024. The output of the balanced photodetector 9024, which can be a single or balanced RF signal, drives antenna element 9026, with the optional inclusion of PA 9025. Up-converted RF signals from each optical channel with their required time delay and amplitude control, i.e. for each of the RF beams, are summed together in the balanced photodetector, so that antenna element 9026 emits electromagnetic radiation that includes the signals from all of the M optical channels. The complete Tx-PAA system, including all N antenna elements, each driven by M RF channels and associated time delays and amplitude control, emits M simultaneous RF beams that are controlled by the associated time delays and amplitude control.

The GAPC devices 800 and 900 shown in FIGS. 15 and 16, and balanced-GAPC devices (i.e. differential-GAPC devices), are ideal devices for use in the Rx-PAA system, as their design trades off device bandwidth with the ability to combine a very large number of RF photonic signals, e.g., 64 RF photonic signals. The same trade-off is not available in the Tx-PAA system, as the combiner/photodetector structure must support the high RF transmit frequency, which may potentially be a millimeter wave frequency. At the same time, the Tx-PAA system may not necessarily require the same very large channel combining capability. While a single photodetector, or a balanced photodetector, provides the highest bandwidth, the amount of RF power from a single device is limited. A single photodetector or balanced photodetector pair when used in the Tx-PAA system is more likely to require a PA to provide the required RF drive to the antenna element. The use of an array photodetector combiner, or GAPC combiner, or balanced versions of either of these devices enables a much higher RF electrical power out of the combiner/photodetector structure, potentially eliminating the need for a PA. However, the need for creating an array device with sufficient bandwidth must also be addressed.

An array photodetector combiner, or balanced array photodetector combiner, is an extreme case of a GAPC or balanced-GAPC device, i.e., the array photodetector combiner can be seen as either a GAPC device with only one Group, or a GAPC device with multiple Groups but only one photodetector per Group. The array photodetector with one photodetector per Group, i.e. a series of photodetectors within a transmission line, maintains the high bandwidth of a single photodetector, while being a more complex device to fabricate. Alternatively having multiple photodetectors combined into a single Group provides twice the RF output power as having a series of single photodetectors within a transmission line (which requires 50 ohm termination at both ends of the transmission line, reducing the power at each termination in half), which improves the PAA system performance. It is advantageous to be able to make a single Group of photodetectors, either for an array photodetector combiner or alternatively as part of a full GAPC device, in which a high bandwidth is better maintained as compared to the bandwidth of a single photodetector. This is accomplished in a separate GAPC/single Group array photodetector concept as described herein. This concept provides an alternative embodiment for the array photodetector combiner 3016 and balanced array photodetector combiner 6020 and 7023, as those shown in FIGS. 21, 24, and 25, as well as alternative and improved GAPC and balanced-GAPC devices.

The GAPC device offers bandwidth improvements over the same number of photodetector devices in a single group, i.e. one version of the photodetector array combiner, as the GAPC utilizes small groups of photodetectors which are then combined in a transmission line to keep the bandwidth equal to that of the group. However, the previously envisioned GAPC device offers a lower operating bandwidth than the individual photodetectors that make up the GAPC device. The new concept herein, provides a way to increase the bandwidth of an array of photodetectors, which also improves the performance of the GAPC device where that array of photodetectors forms one group of the GAPC device. To understand this concept, consider the energy diagram of a well-known high-speed, high-power, high-linearity photodetector, the prior art Modified Uni-Traveling Carrier (MUTC) photodetector, as shown in FIG. 28, as well as the table shown in FIG. 29. The MUTC photodetector is a high-performance photodetector device popularized by the research groups of Campbell and Beling at The University of Virginia.

The speed of an MUTC photodetector is set by both the parasitic bandwidth of the device (RC time constant) and the transit time bandwidth of the device—that is due to the time it takes carriers to pass across depleted layers in the device (shown as $d_{abs}$, $d_{abs,int}$ and $d_{drift}$ in FIG. 28). In the GAPC design (which is the same for a single Group, i.e., an array photodetector combiner), a very small capacitance is required for each of the individual photodetectors, which are then combined in parallel to form a 'Group', in the Group the capacitance of each photodetector is added together to provide a much larger Group capacitance. The speed of the Group is therefore much lower than that of a single photodetector, due to the higher capacitance. In this new concept, the transit time of the individual photodetectors in the Group is designed to be longer/slower, to be better aligned with the parasitic bandwidth of the Group. In a single high-speed photodetector, both the capacitance and transit time are optimized together to provide the high-speed device; a similar transit time bandwidth and parasitic (capacitance based) bandwidth provide the optimum device. However, increasing the transit time and therefore reducing the transit time based bandwidth actually reduces the capacitance of the photodetector (increasing the parasitic bandwidth)—this fact can be utilized to improve the overall performance of a group/array of photodetectors. In the case of the GAPC device, a photodetector with very low capacitance is required, i.e. equivalent to a 40 GHz or faster PD, while the transit time bandwidth need only be fast enough for the Group, or overall GAPC performance. In a single Group/array photodetector, the maximum bandwidth attainable for a specific number of photodetectors is required. The new concept changes the MUTC photodetector design for use in a GAPC device or single Group/array photodetector, to provide improved array photodetector performance. The concept employs the fact that the transit time of the MUTC photodetector design can be increased (from that of a single photodetector) because the photodetectors are utilized in a Group, which reduces the capacitance of each individual photodetector and therefore reduces the capacitance of the Group, improving the overall performance of the GAPC.

As an example, the table shown in FIG. 29 provides a comparison of the capacitance-based, transit time-based, and overall device bandwidths for a single photodetector, a single Group/array of 8 photodetectors, and a single Group/array of 32 photodetectors, each for a prior art design of an MUTC photodetector as well as two Extended Transit Time MUTC designs, for use in an Extended Transit Time Array Photodetector Combiner (ETT-APC), which are embodiments of the present invention. The standard MUTC photodetector has a depletion width of 1.1 µm, which gives it a transit time bandwidth of 71 GHz. These additional two exemplary embodiments of the present invention increase this transit time by extending the depletion width of the MUTC photodetector. Two designs are described here. The first extends the depletion width to 2 µm, while the second extends the depletion width to 4 µm. These two designs have simulated transit time bandwidths of 30 GHz and 14 GHz, respectively. By extending the depletion width, the capacitance of the photodetector is reduced as shown in the table of FIG. 29. A standard MUTC design provides 21 fF capacitance for a device active area of 5×40 (200) µm², while the calculated capacitance for the same active area for the 2 µm extended transit time device is 12 fF, and the capacitance for the device with 4 µm extended transit time is only 6 fF. The parasitic bandwidths of these three devices are therefore 74 GHz, 130 GHz, and 260 GHz, respectively. For a single photodetector, the prior art design is preferred, providing an overall device bandwidth of 51 GHz. The bandwidth of the two extended transit time designs are limited by the transit time bandwidth, providing overall device bandwidths of 29 GHz and 14 GHz, for the 2 µm and 4 µm depletion width devices, respectively. In contrast, when combining 8 photodetectors together, the calculation for optimal device parameters changes. The transit time bandwidth remains the same for all devices, i.e., 71 GHz, 30 GHz, and 14 GHz, respectively; however, the parasitic bandwidth of the prior art design reduces to 9.25 GHz, and the extended transit time devices have parasitic bandwidths of 16.25 GHz and 32.5 GHz, respectively. The total bandwidths for the three devices are then 9.2 GHz (Prior Art), 14.3 GHz (2 µm depletion width), and 12.85 GHz (4 µm depletion width). For a group/array of 8 photodetectors, the 2 µm depletion width extended transit time design has the highest bandwidth. Furthermore, in a large array of 32 photodetectors, the parasitic bandwidth becomes 2.3 GHz for the prior art design, 4 GHz for the 2 µm extended transit time device, and 8 GHz for the 4 µm extended transit time device. The total bandwidths in these exemplary cases are 2.3 GHz (Prior Art), 4 GHz (2 µm depletion width), and 7 GHz (4 µm depletion width). Therefore, for a Group/array of 32 photodetectors, the 4 µm depletion width extended transit time design results in the highest bandwidth. This illustrates one advantage of this extended transit time concept, which may be used for a single Group/array of photodetectors, as well as in the full GAPC device. The same design approach applies for a balanced Group/array device or for a full balanced-GAPC device.

Non-limiting embodiments of the present invention are as follows:

A transmit phased array antenna, comprising N channels, each channel of the N channels supporting a transmit antenna element, wherein a plurality of transmit antenna elements comprise said transmit phased array antenna, J photonic integrated circuits (PICs), where J≥1, each of said J PICs comprising K complete optical channels on a common substrate, where K≥1, said K complete optical channels supporting one of said N channels, where J×K≥N, each of said N channels comprising a signal laser, said signal laser providing an optical carrier, an electrical radio frequency (RF) signal, said RF signal driving a modulator, said modulator modulating said optical carrier from the signal laser to form an optical RF signal, a tunable time delay device for receiving said optical RF signal, said tunable time delay device imparting a chosen time delay on the optical RF signal, an amplitude control device for receiving a time delayed optical RF signal, said amplitude control device adjusting an amplitude of the time-delayed optical RF signal, and a photodetector for receiving a time-delayed and amplitude controlled optical RF signal, said photodetector converting the time-delayed and amplitude controlled optical RF signal to an electrical signal, said electrical signal driving a corresponding one of said plurality of transmit antenna elements, wherein a digital signal processor (DSP) provides a collective output from said time delays and said amplitude controls via said transmit phased array antenna with predetermined RF beamforming parameters, and wherein said plurality of antenna elements transmit a free space RF signal with an RF beam, said RF beam having said predetermined RF beamforming parameters.

In some aspects, the antenna comprises 64 transmit antenna elements.

In some aspects, the antenna comprises 1024 of the N channels.

In some aspects, the antenna comprises an electronic power amplifier, said power amplifier increasing the electrical signal driving said corresponding one of said plurality of transmit antenna elements.

In some aspects, each of said transmit antenna elements receives signals from M optical channels, providing a total of N×M optical channels of the antenna, said M optical channels providing signals for M independent RF beams.

In some aspects, the photodetector is an array photodetector combiner, said array photodetector combiner combining signals from all of said M channels to form a single electrical signal.

In some aspects, the photodetector is a group array photodetector combiner (GAPC) device.

In some aspects, each signal laser is a wavelength division multiplexing (WDM) laser, the antenna further comprising a WDM combiner.

In some aspects, each channel of said N channels further comprises a tunable filter for selecting a frequency band for up-conversion from said modulated optical RF signal, a second laser, said second laser corresponding to an optical Local Oscillator (LO) signal, said optical LO signal being used to up-convert said modulated optical RF signal, a tunable phase delay for controlling an optical phase of the optical LO signal, and a coupler for combining the optical RF signal with the optical LO signal, said coupler providing two optical outputs, wherein said photodetector is a balanced photodetector that receives said two optical outputs from said coupler.

In some aspects, each one of said transmit antenna elements receives signals from M optical channels, where M≥2, said M optical channels providing signals for M independent RF beams.

In some aspects, said balanced photodetector is a balanced array photodetector combiner, said balanced array photodetector combiner combining signals from all of said M optical channels to form a single electrical signal.

In some aspects, said balanced photodetector is a balanced GAPC device.

In some aspects, the signal laser and the second laser are WDM lasers, the antenna further comprising a WDM combiner.

In some aspects, each of said N channels further comprises a splitter for providing the optical RF signal and optical LO signal, a tunable filter to select a frequency band for up-conversion from the modulated optical RF signal, a tunable filter to select the chosen optical LO signal from the modulated optical LO signal, a tunable phase delay for controlling an optical phase of the chosen optical LO signal, and a coupler for combining the optical RF signal with the optical LO signal, said coupler providing two optical outputs, wherein said photodetector is a balanced photodetector receiving said two optical outputs from said coupler.

In some aspects, each of said transmit antenna elements receives signals from M optical channels, said M optical channels providing signals for M independent RF beams.

In some aspects, said balanced photodetector is a balanced array photodetector combiner.

In some aspects, said balanced photodetector is a balanced GAPC device.

In some aspects, the signal laser is a WDM laser, the antenna further comprising a WDM combiner.

In some aspects, the invention comprises an Extended Transit Time Array Photodetector Combiner (ETT-APC), comprising an array of Y photodetectors, where Y≥2, that receives a series of Y optical signals, one optical signal to each photodetector, wherein a bandwidth of the ETT-APC comprises a combination of a transit time bandwidth of each individual photodetector and a parasitic bandwidth of the array of photodetectors, wherein the bandwidth of the ETT-APC is increased by reducing the transit time bandwidth, thereby increasing the parasitic bandwidth of the array and an overall device bandwidth, a final transit time bandwidth being optimized for a number of said photodetectors in the array.

In some aspects, this forms one group of a Group Array Photodetector Combiner (GAPC) device, said GAPC device including X groups, where X≥2, wherein each group of X groups is electrically connected to a next group of X groups by inductance L, and wherein a capacitance, C, and inductors produce an artificial transmission line having an impedance Z, using inductor values of L within the artificial transmission line and inductor values of L/2 at ends of the artificial transmission line, where $Z=\text{sqrt}(L/C)$.

Although several exemplary embodiments have been herein shown and described, those of skill in the art will recognize that many modifications and variations are possible without departing from the spirit and scope of the invention, and it is intended to measure the invention only by the appended claims.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A transmit phased array antenna, comprising:
N channels, where N≥1, each channel of the N channels supporting a transmit antenna element, wherein a plurality of the transmit antenna elements comprise said transmit phased array antenna,
J photonic integrated circuits (PICs), where J≥1, each of said J PICs comprising K complete optical channels on a common substrate, where K≥1, said K complete optical channels supporting one of said N channels, where J×K≥N,
each of said N channels comprising:
a signal laser, said signal laser providing an optical carrier, an electrical radio frequency (RF) signal, said RF signal driving a modulator, said modulator modulating said optical carrier from the signal laser to form an optical RF signal, a tunable time delay device for receiving said optical RF signal, said tunable time delay device imparting a chosen time delay on the optical RF signal, an amplitude control device for receiving the time delayed optical RF signal, said amplitude control device adjusting an amplitude of the time-delayed optical RF signal, and a photodetector for receiving the time-delayed and amplitude controlled optical RF signal, said photodetector converting the time-delayed and amplitude controlled optical RF signal to an electrical signal, said electrical signal driving a corresponding one of said plurality of transmit antenna elements, wherein a digital signal processor (DSP) provides a collective output from said time delays and said amplitude controls via said transmit phased array antenna with predetermined RF beamforming parameters, wherein said plurality of antenna elements transmit a free space RF signal with an RF beam, said RF beam having said predetermined RF beamforming parameters.

2. The antenna of claim 1, comprising 64 transmit antenna elements.

3. The antenna of claim 1, wherein N=1024.

4. The antenna of claim 1, further comprising an electronic power amplifier, said power amplifier increasing the electrical signal driving said corresponding one of said plurality of transmit antenna elements.

5. The antenna of claim 1, wherein each of said transmit antenna elements receives signals from M optical channels, providing a total of N×M optical channels of the antenna, said M optical channels providing signals for M independent RF beams.

6. The antenna of claim 5, wherein the photodetector is an array photodetector combiner, said array photodetector combiner combining signals from all of said M channels to form a single electrical signal.

7. The antenna of claim 5, wherein the photodetector is a group array photodetector combiner (GAPC) device.

8. The antenna of claim 5, wherein each one of said signal lasers is a wavelength division multiplexing (WDM) laser, the antenna further comprising a WDM combiner.

9. The antenna of claim 1, wherein each channel of said N channels further comprises:

a tunable filter for selecting a frequency band for an up-conversion from said optical RF signal, a second laser, said second laser corresponding to an optical Local Oscillator (LO) signal, said optical LO signal being used to up-convert said optical RF signal, a tunable phase delay for controlling an optical phase of the optical LO signal, and a coupler for combining the optical RF signal with the optical LO signal, said coupler providing two optical outputs, wherein said photodetector is a balanced photodetector that receives said two optical outputs from said coupler.

10. The antenna of claim 9, wherein each one of said transmit antenna elements receives signals from M optical channels, where M≥2, said M optical channels providing signals for M independent RF beams.

11. The antenna of claim 10, wherein said balanced photodetector is a balanced array photodetector combiner, said balanced array photodetector combiner combining signals from all of said M optical channels to form a single electrical signal.

12. The antenna of claim 10, wherein said balanced photodetector is a balanced GAPC device.

13. The antenna of claim 10, wherein the signal laser and the second laser are WDM lasers, the antenna further comprising a WDM combiner.

14. The antenna of claim 1, each of said N channels further comprising:

a splitter for providing a modulated optical RF signal and a modulated optical local oscillator (LO) signal, a tunable filter to select a frequency band for up-conversion from the modulated optical RF signal to form an up-converted optical RF signal, a tunable filter to select a chosen optical LO signal from the modulated optical LO signal, a tunable phase delay for controlling an optical phase of the chosen optical LO signal, and a coupler for combining the up-converted optical RF signal with the chosen optical LO signal, said coupler providing two optical outputs, wherein said photodetector is a balanced photodetector receiving said two optical outputs from said coupler.

15. The antenna of claim 14, wherein each of said transmit antenna elements receives signals from M optical channels, said M optical channels providing signals for M independent RF beams.

16. The antenna of claim 15, wherein said balanced photodetector is a balanced array photodetector combiner.

17. The antenna of claim 15, wherein said balanced photodetector is a balanced GAPC device.

18. The antenna of claim 15, wherein the signal laser is a WDM laser, the antenna further comprising a WDM combiner.

* * * * *